(12) United States Patent
Lin et al.

(10) Patent No.: US 11,749,683 B2
(45) Date of Patent: *Sep. 5, 2023

(54) ISOLATION STRUCTURE FOR PREVENTING UNINTENTIONAL MERGING OF EPITAXIALLY GROWN SOURCE/DRAIN

(71) Applicant: Taiwan Semiconductor Manufacturing Co., Ltd., Hsin-Chu (TW)

(72) Inventors: Ta-Chun Lin, Hsinchu (TW); Kuan-Lin Yeh, Hsinchu (TW); Chun-Jun Lin, Hsinchu (TW); Kuo-Hua Pan, Hsinchu (TW); Mu-Chi Chiang, Hsinchu (TW)

(73) Assignee: TAIWAN SEMICONDUCTOR MANUFACTURING CO. LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,243

(22) Filed: Apr. 25, 2022

(65) Prior Publication Data

US 2022/0246613 A1 Aug. 4, 2022

Related U.S. Application Data

(63) Continuation of application No. 16/917,778, filed on Jun. 30, 2020, now Pat. No. 11,315,924.

(51) Int. Cl.
*H10B 10/00* (2023.01)
*H01L 27/092* (2006.01)
(Continued)

(52) U.S. Cl.
CPC ........ *H01L 27/0924* (2013.01); *H01L 21/762* (2013.01); *H01L 21/76831* (2013.01); *H01L 21/823814* (2013.01); *H01L 21/823821* (2013.01); *H01L 21/823842* (2013.01); *H01L 21/823878* (2013.01); *H01L 29/0649* (2013.01);
(Continued)

(58) Field of Classification Search
CPC .............. H01L 27/0924; H01L 21/762; H01L 29/66553; H01L 29/0649; H01L 21/76831; H01L 21/823842; H01L 21/823821; H01L 29/7851; H01L 29/66795; H01L 21/823814; H01L 29/66545; H01L 21/823878; H10B 10/12
See application file for complete search history.

(56) References Cited

U.S. PATENT DOCUMENTS 8,796,666 B1 8/2014 Huang et al.
8,815,712 B2 8/2014 Wan et al.
(Continued)

*Primary Examiner* — Karen Kusumakar
*Assistant Examiner* — Adam S Bowen
(74) *Attorney, Agent, or Firm* — HAYNES AND BOONE, LLP

(57) ABSTRACT

A semiconductor device includes a first active region and a second active region disposed over a substrate. A first source/drain component is grown on the first active region. A second source/drain component is grown on the second active region. An interlayer dielectric (ILD) is disposed around the first source/drain component and the second source/drain component. An isolation structure extends vertically through the ILD. The isolation structure separates the first source/drain component from the second source/drain component.

20 Claims, 46 Drawing Sheets

(51) Int. Cl.

|  |  |
|---|---|
| *H01L 29/78* | (2006.01) |
| *H01L 29/06* | (2006.01) |
| *H01L 29/66* | (2006.01) |
| *H01L 21/8238* | (2006.01) |
| *H01L 21/762* | (2006.01) |
| *H01L 21/768* | (2006.01) |

(52) U.S. Cl.
CPC .. *H01L 29/66545* (2013.01); *H01L 29/66553* (2013.01); *H01L 29/66795* (2013.01); *H01L 29/7851* (2013.01); *H10B 10/12* (2023.02)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2019/0067417 A1* | 2/2019 | Ching ............. H01L 21/823431 |
| 2019/0067444 A1* | 2/2019 | Ching ............. H01L 21/02057 |
| 2019/0096765 A1* | 3/2019 | Ching ............. H01L 21/823418 |

* cited by examiner

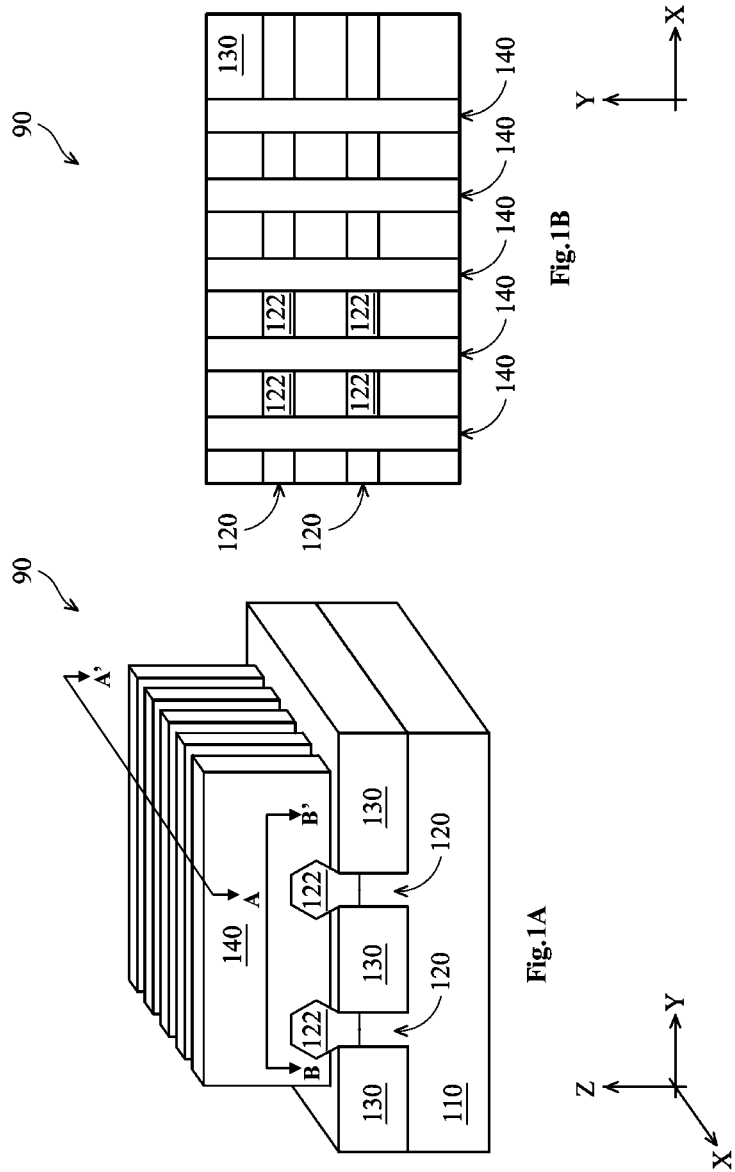

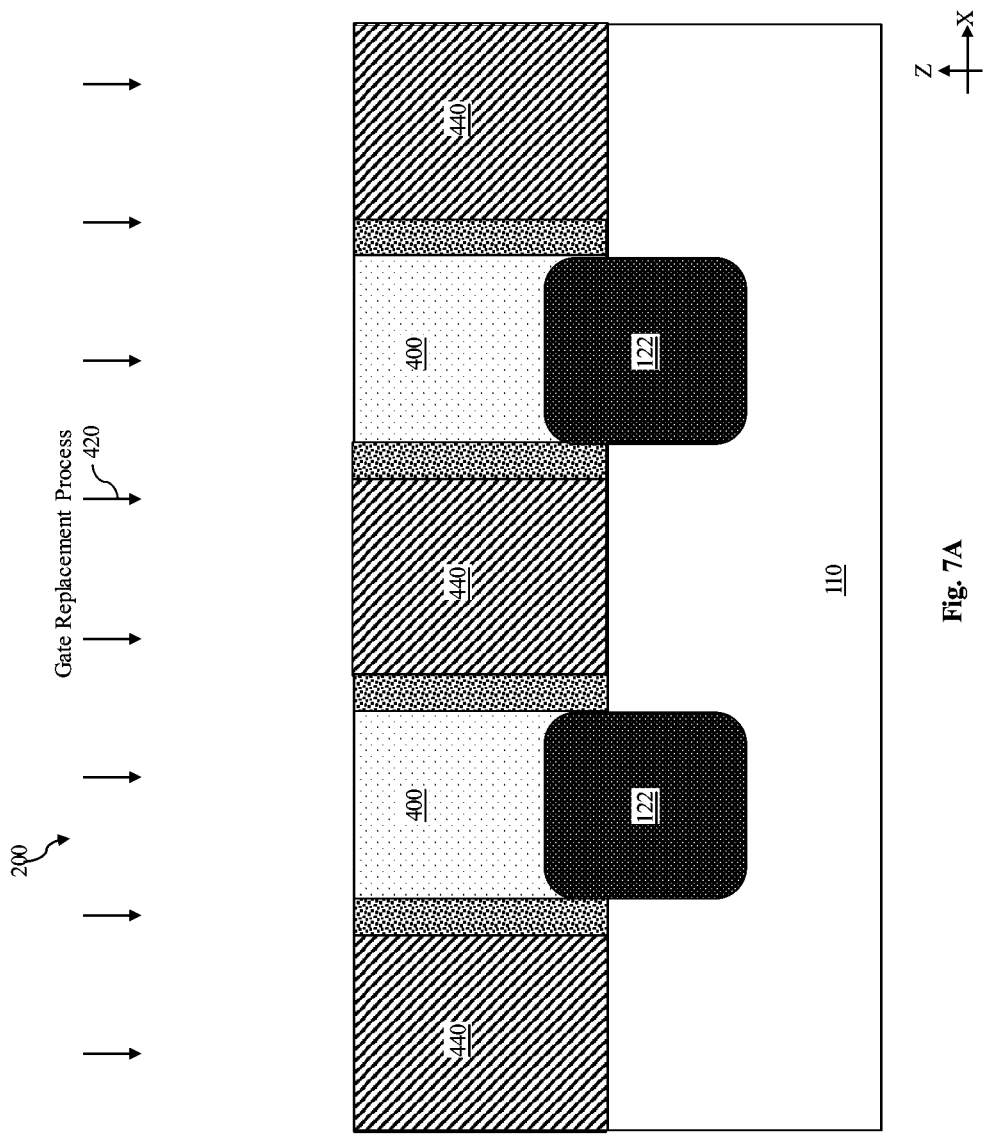

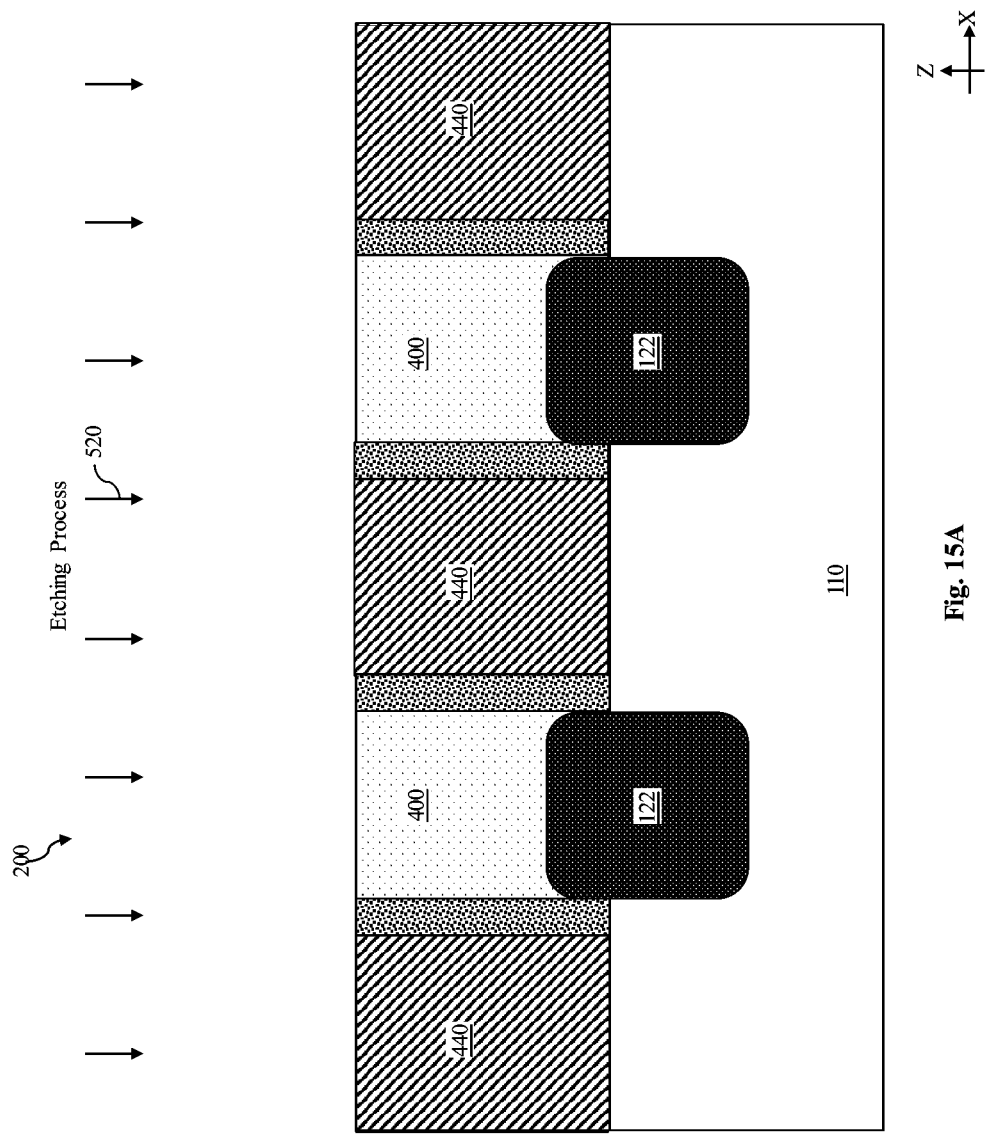

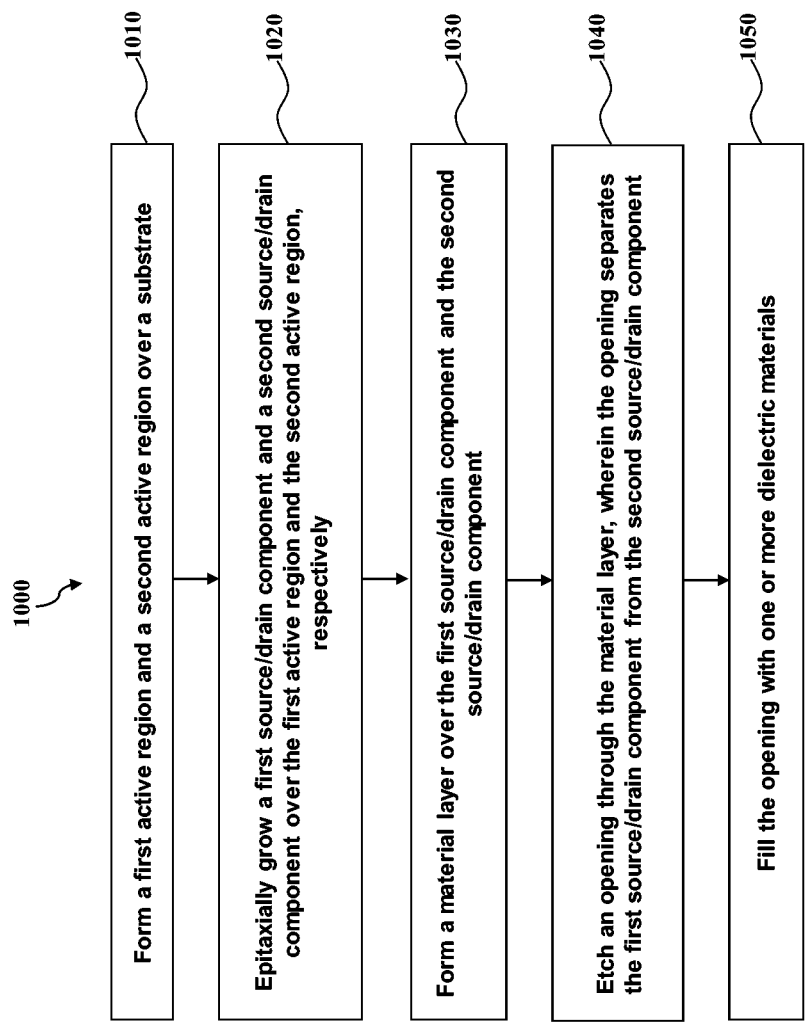

ISOLATION STRUCTURE FOR PREVENTING UNINTENTIONAL MERGING OF EPITAXIALLY GROWN SOURCE/DRAIN

PRIORITY DATA

The present application is a continuation of U.S. patent application Ser. No. 16/917,778, filed on Jun. 30, 2020, entitled "Isolation Structure For Preventing Unintentional Merging of Epitaxially Grown Source/Drain", the contents of which are hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, the space between adjacent transistors becomes smaller and smaller. The small spacing may cause the epitaxial source/drain features between adjacent transistors to merge into one another, which leads to electrical shorting between the adjacent transistors. Electrical shorting is undesirable because it may degrade device performance or even cause device failures.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a perspective view of an IC device in the form of a FinFET according to various aspects of the present disclosure.

FIG. 1B is a planar top view of an IC device in the form of a FinFET according to various aspects of the present disclosure.

FIGS. 2A-21A, 2B-21B, and 22 are cross-sectional side views of various embodiments of IC devices at various stages of fabrication according to various aspects of the present disclosure.

FIG. 25 is a flowchart illustrating a method of fabricating a semiconductor device according to various aspects of the present disclosure.

DETAILED DESCRIPTION

Figure 1C:
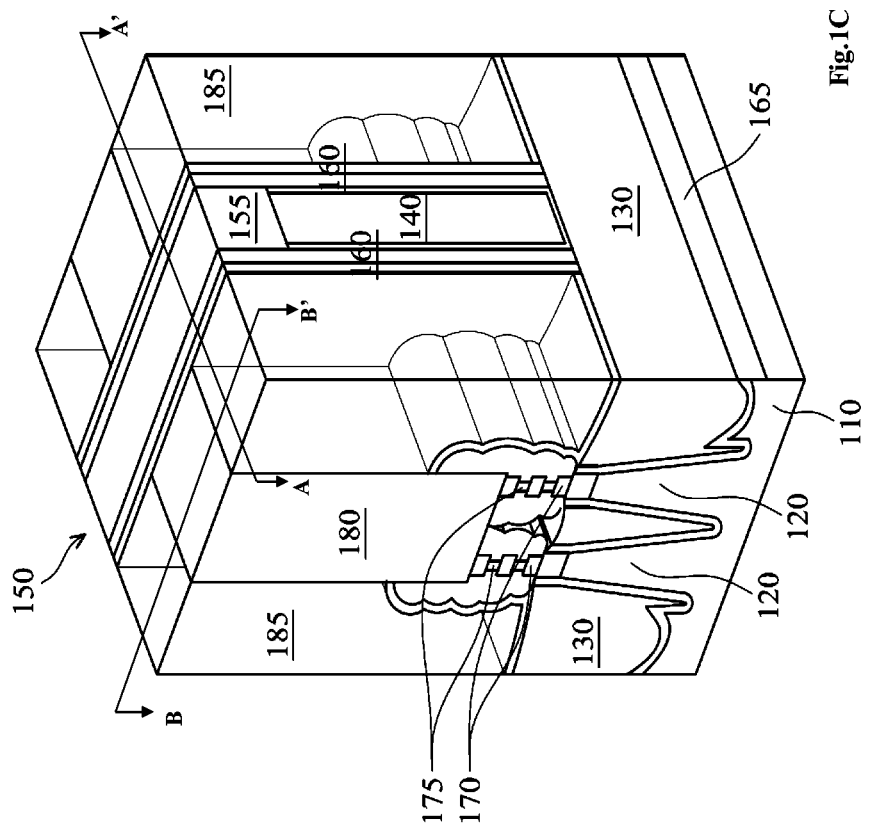
FIG. 1C is a perspective view of an IC device in the form of a GAA device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices. One aspect of the present disclosure involves forming isolation structures to electrically isolate the epitaxially grown source/drain components from adjacent transistors. As a result, device yield, reliability, and/or performance may be improved, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2A-21A and 2B-21B illustrate the cross-sectional side views of an IC device 200 at different stages of fabrication. FIGS. 2A-21A correspond to the cross-sectional cuts taken along an X-direction, for example along the cutline A-A' in FIG. 1A. As such, FIGS. 2A-21A may be referred to as X-cut Figures. FIGS. 2B-21B correspond to the cross-sectional cuts taken along an Y-direction, for example along the cutline B-B' in FIG. 1A. As such, FIGS. 2B-21B may be referred to as Y-cut Figures. For reasons of consistency and clarity, similar components appearing in FIGS. 2A-21A and 2B-21B will be labeled the same.

Figure 2A:
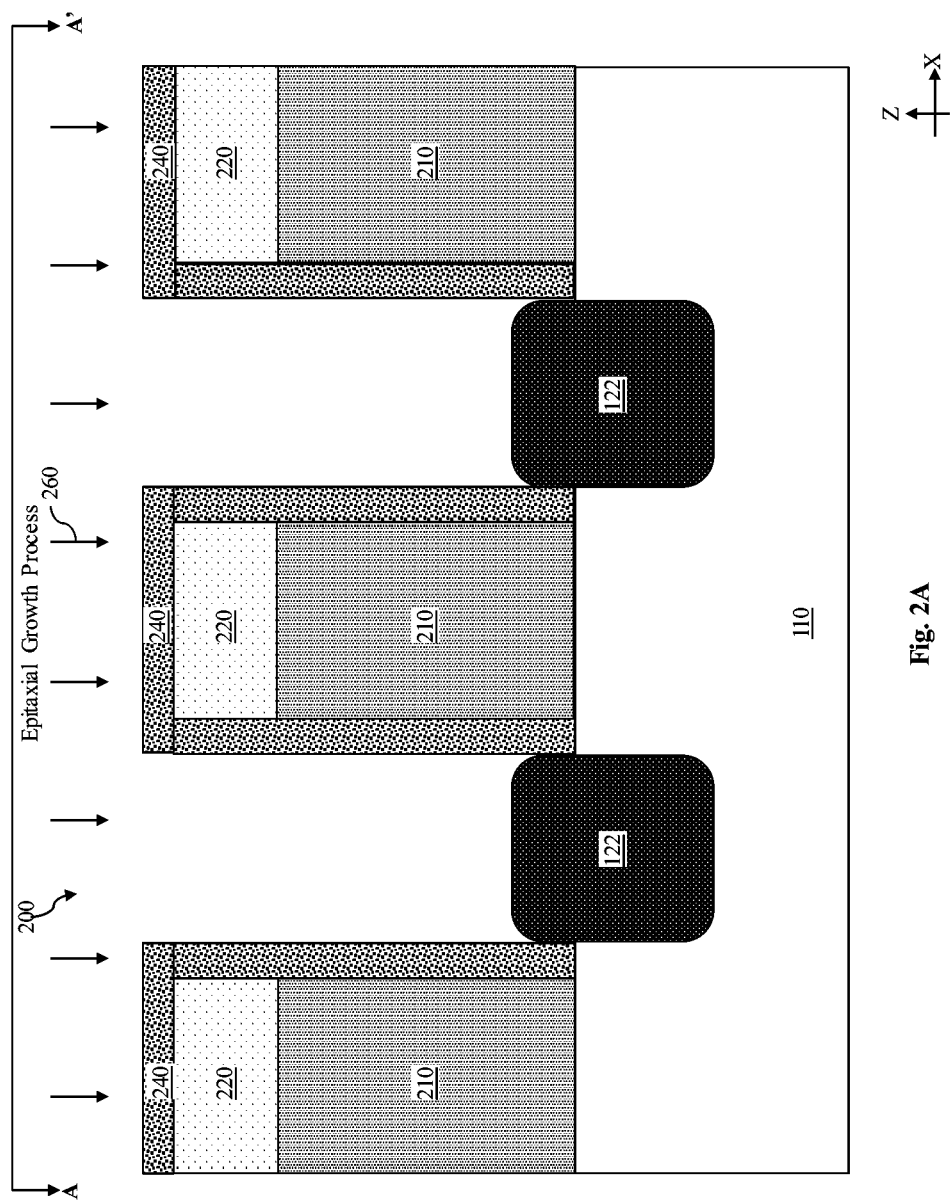
Figure 2B:
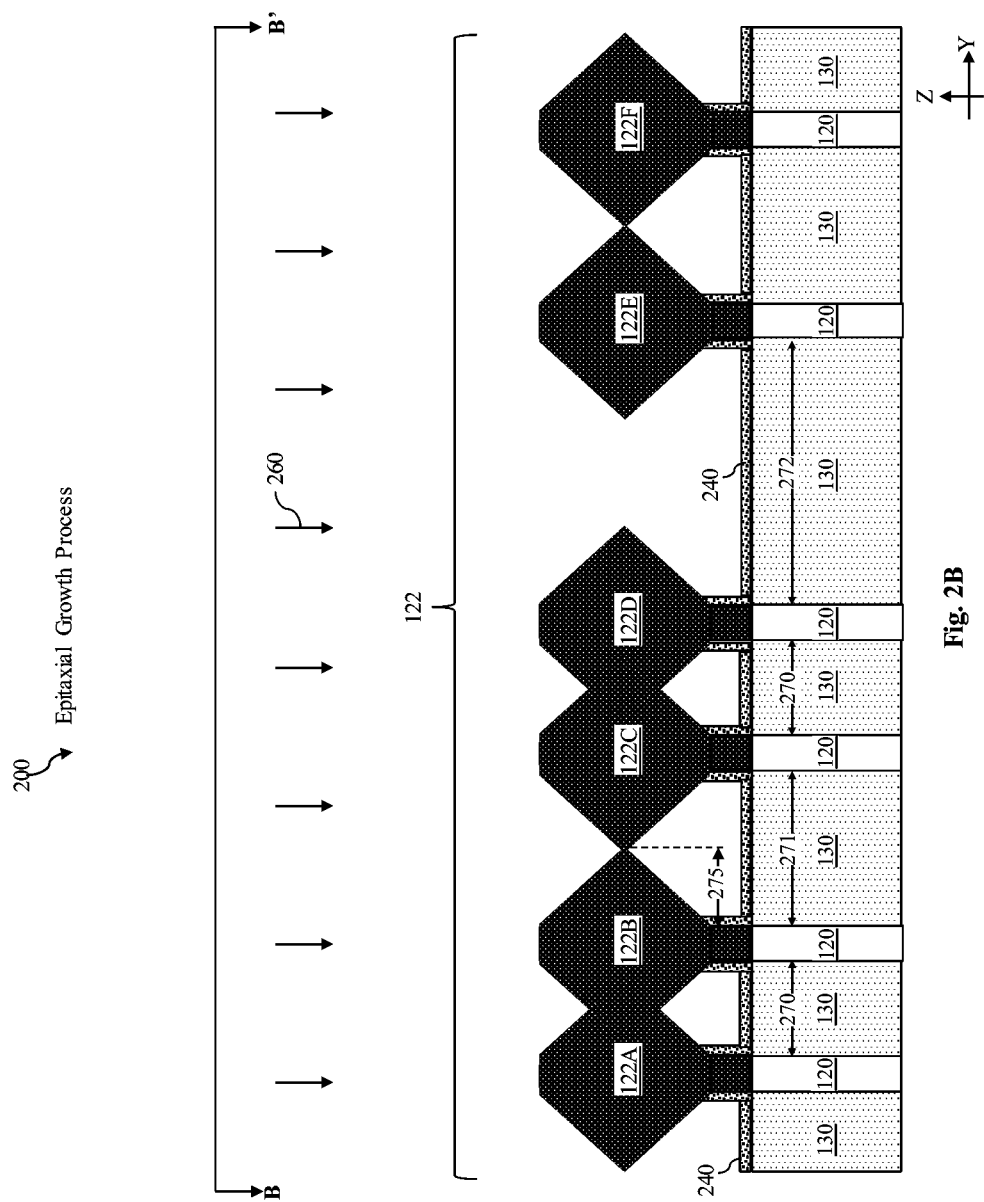

Referring to FIGS. 2A-2B, the IC device 200 includes the substrate 110 discussed above with reference to FIGS. 1A-1C, for example a silicon substrate. The substrate includes a plurality of active regions, for example the fin structures 120 discussed above with reference to FIGS. 1A-1B. The fin structures 120 each extends laterally in the X-direction, and they are separated from one another in the Y-direction by the isolation structures 130.

As shown in FIG. 2A, the IC device 200 also includes dummy gate structures 210 that are disposed over the substrate 110. The dummy gate structures 210 may each include a dummy gate dielectric layer and a polysilicon gate electrode, and they will be removed in a gate replacement process discussed below. A plurality of hard masks 220 are disposed over the dummy gate structures 210. The hard masks 220 may be used to define the dummy gate structures 210 in one or more patterning processes. Gate spacers 240 are formed on the sidewalls of the dummy gate structures 210 and the hard masks 220. The gate spacers 240 may each include a dielectric material, for example silicon nitride (SiN), silicon carbon nitride (SiCN), or silicon carbon oxynitride (SiCON).

An epitaxial growth process 260 may be performed to the IC device 200 to epitaxially grow source/drain components 122 of the FinFET transistors. The source/drain components 122 are grown on/over the fin structures 120 (as shown in FIG. 2B), and between the dummy gate structures 210 (as shown in FIG. 2A). These source/drain components 122 may belong to different transistors. As a non-limiting example shown in FIG. 2B, the source/drain components 122A and 122B belong to a first NFET, the source/drain components 122C and 122D belong to a second NFET, the source/drain component 122E belong to a first PFET, and the source/drain component 122F belong to a second PFET.

The fin structures 120 on which the source/drain components 122A and 122B are grown are separated by a spacing 270. The same is true for the source/drain components 122C and 122D. In some embodiments, the spacing 270 is in a range between about 20 nanometers (nm) and about 32 nm. This range of the spacing 270 is configured to facilitate the merging of the source/drain components 122A-122B into each other (and the source/drain components 122C-122D into each other), which is desirable since they belong to the same transistor. In comparison, the fin structures 120 on which the source/drain components 122B and 122C are grown are separated by a spacing 271 that is greater than the spacing 270. In some embodiments, the spacing 271 is in a range between about 50 nm and about 100 nm. In some embodiments, a ratio of the spacing 271 and the spacing 270 is in a range between about 1.5:1 and about 20:1. Also as shown in FIG. 2B, an outermost tip of the source/drain component (such as the source/drain component 122B) protrudes beyond a side surface of a nearest fin structure 120 by a distance 275. In other words, the distance 275 is indicative of how much a source/drain component protrudes laterally beyond the fin structure 120 on which it is grown. In some embodiments, a ratio of the distance 275 and the spacing 271 is in a range between about 1:2.5 and about 1:25.

A physical separation of the source/drain components 122B and 122C is desired, since they belong to different transistors, which should be kept physically and electrically separate. However, as transistors sizes continue to shrink, the larger spacing 271 (compared to the spacing 270) still may not be able to guarantee the physical separation between the source/drain components 122B and 122C from adjacent transistors. Sometimes, the source/drain components 122B and/or 122C may be grown to be larger than expected, which could cause the source/drain components 122B and 122C to inadvertently merge into each other. For example, when the ratio of the distance 275 and the spacing 271 approach about 1:2, the source/drain components from adjacent transistors may be at risk of merging into one another, even though they are meant to be kept separate. Process variations (e.g., alignment and/or overlay controls) may further exacerbate this problem.

Similarly, the source/drain components 122E-122F may merge into each other due to the shrinking spacing 273 between the fin structures 120 on which the source/drain components 122E-122F are formed, even though the source/drain components 122E-122F should be kept physically separate from each other, since they are from different PFETs. The merging of the source/drain components 122B-122C or the merging of the source/drain components 122E-122F may cause electrical shorting between transistors that should otherwise be electrically isolated from each other, which could degrade the performance and/or lower the yield of the IC device 200.

It is also noted that the electrical shorting may occur not only between adjacent NFETs (as is the case between the source/drain components 122B and 122C), or between adjacent PFETs (as is the case between the source/drain components 122E and 122F), but it may also occur between an NFET and a PFET that are located adjacent to one another too. For example, the fin structures 120 on which the source/drain components 122D and 122E are grown are separated by a spacing 272. The spacing 272 is configured to be larger than the spacing 271 to prevent the merging between the source/drain components 122D and 122E. However, the ever-shrinking device sizes and potential process variations may even cause the merging between the source/drain components 122D (from an NFET) and 122E (from a PFET) in some devices, even though the spacing 272 is large enough to prevent such a merging in most device. Again, such an unintentional merging between the adjacent NFET and PFET devices would be undesirable, as it could degrade device performance or lower yield.

In order to overcome this unintentional source/drain merging problem discussed above, the present disclosure will implement electrical isolation structures between the source/drain components that are at risk of merging into one another. These electrical isolation structures may be implemented at different stages of fabrication, as discussed below in more detail.

Figure 3A:
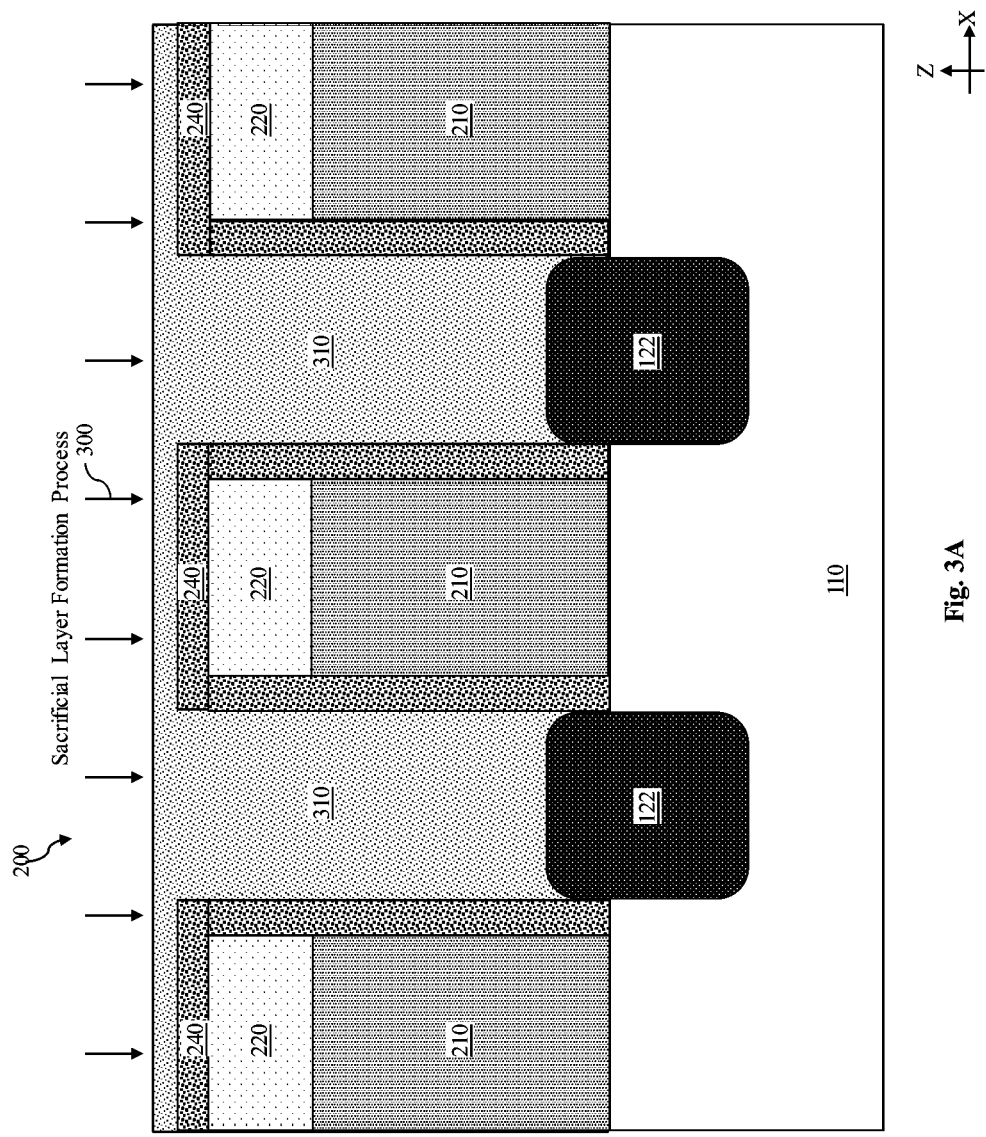
Figure 3B:
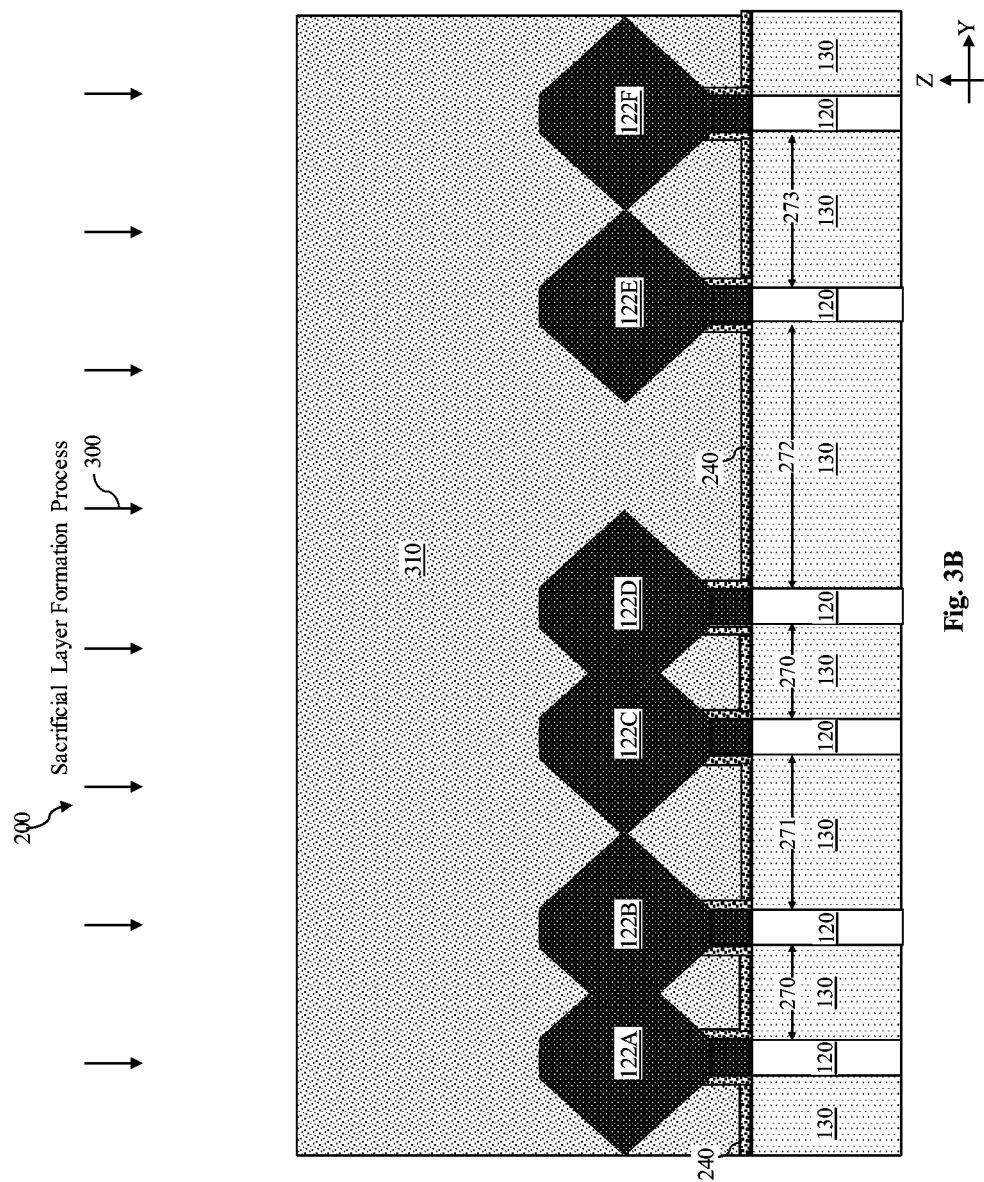

Referring now to FIGS. 3A and 3B, a sacrificial layer formation process 300 is performed to the IC device 200 to form a sacrificial layer 310. The sacrificial layer formation process 300 may include a spin coating process, or a deposition process such as CVD, PVD, ALD, or combinations thereof. In some embodiments, the sacrificial layer 310 includes a photoresist material. In other embodiments, the sacrificial layer 310 includes a dielectric material such as an oxide material. The sacrificial layer 310 is formed over and covers the dummy gate structures 210, the gate spacers 240, and the source/drain components 122.

Figure 4A:
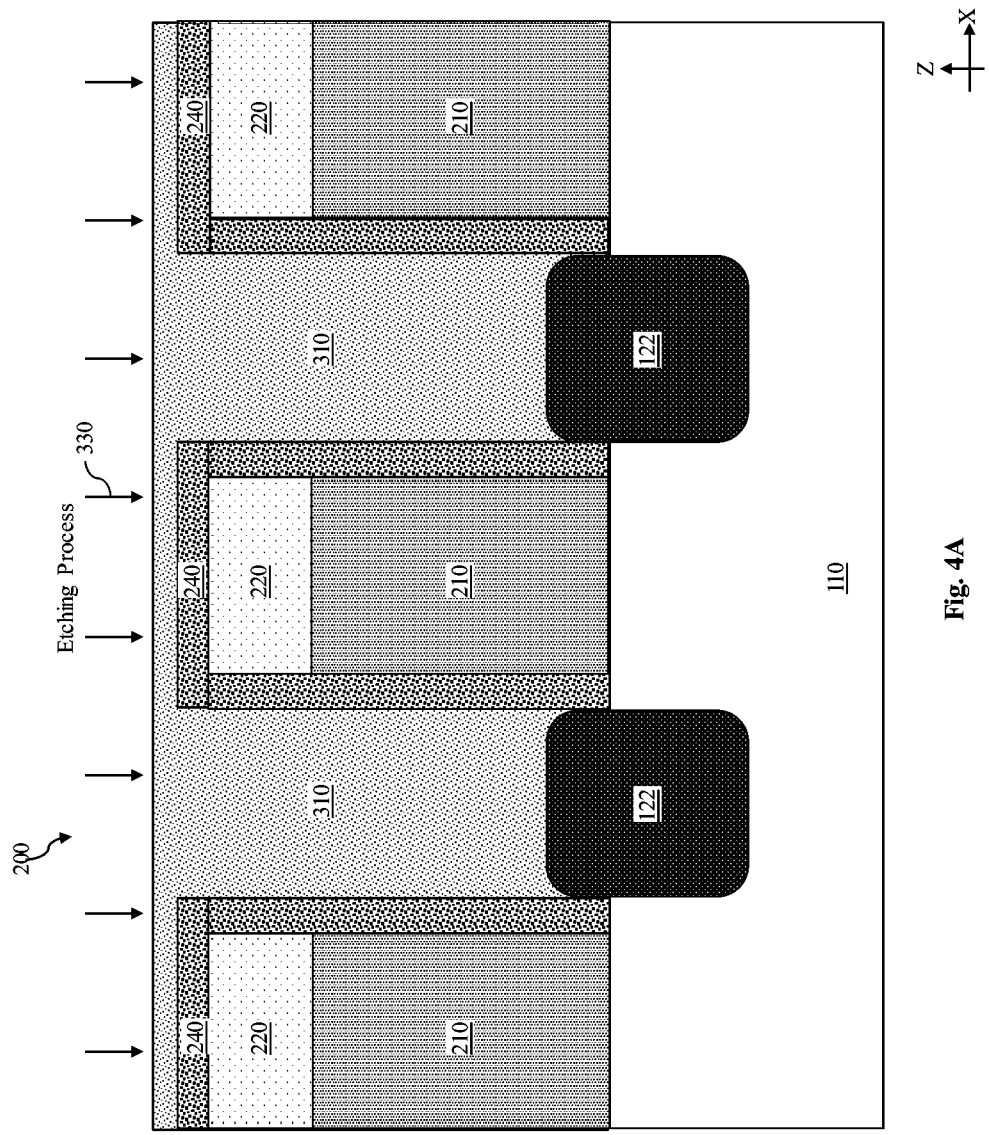
Figure 4B:
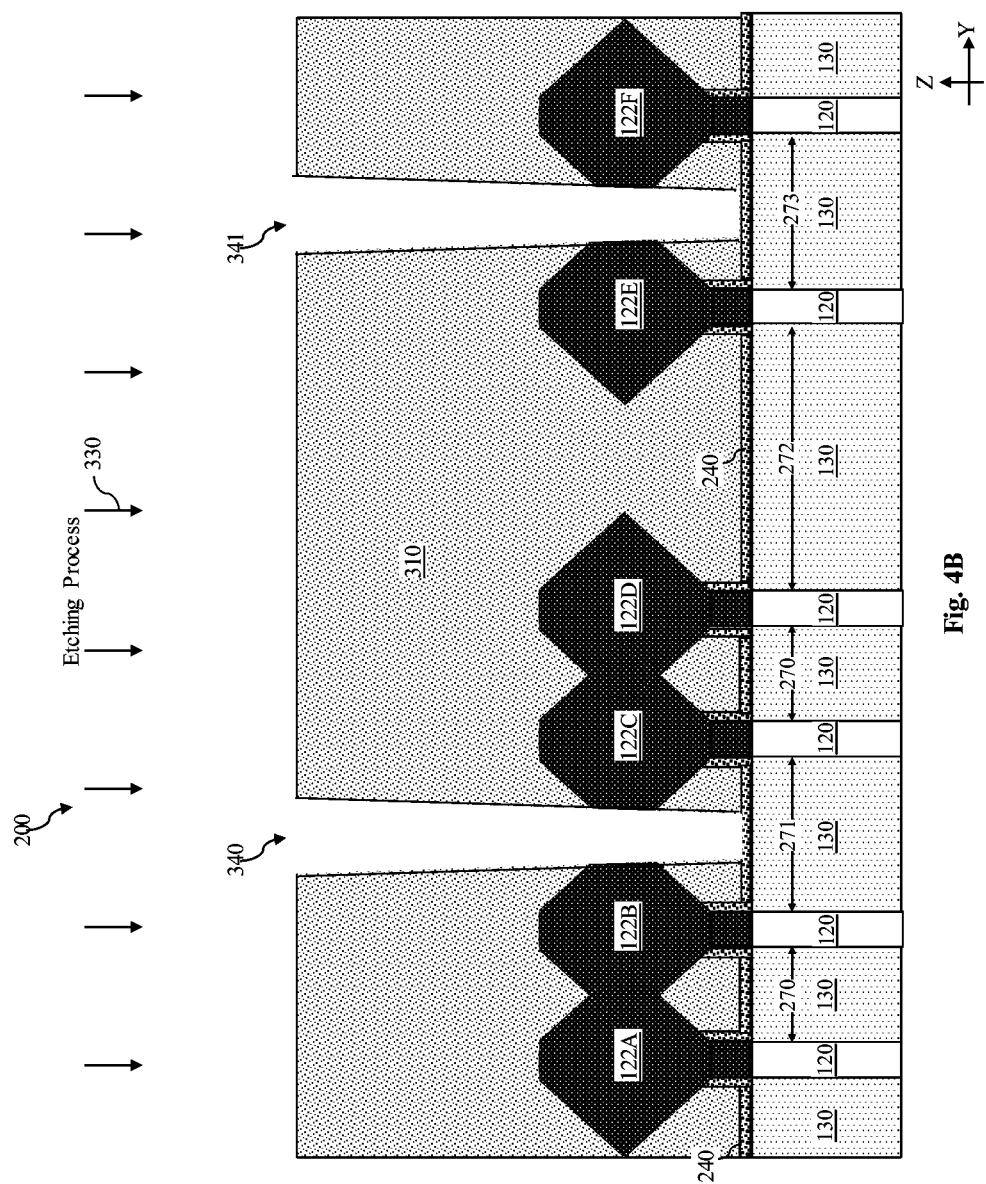

Referring now to FIGS. 4A-4B, an etching process 330 is performed to the IC device 200 to form openings (also referred to as recesses or trenches) 340 and 341. The opening 340 extends vertically through the sacrificial layer 310 and "breaks up" the merged portions of the source/drain components 122B-122C of the NFETs. The opening 341 extends vertically through the sacrificial layer 310 and "breaks up" the merged portions of the source/drain components 122E-122F of the PFETs. In other words, the etching process 330 also removes portions of the source/drain components 122B-122C and 122E-122F, such that they are no longer in physical contact with each other. In some embodiments, the openings 340 and 341 may each have a trapezoidal profile, where the openings 340 and 341 are widest at the top, and the openings 340 and 341 become narrower as they extend deeper downward. Note that due to the location of the cross-sectional cut of FIG. 4A, the openings 340-341 are not directly visible in FIG. 4A. It is understood that in some other embodiments, an opening may also be etched between the source/drain components 122D-122E, so as to prevent the potential merging between them, if these source/drain components 122D-122E are supposed to be kept electrically separate from each other.

Figure 5A:
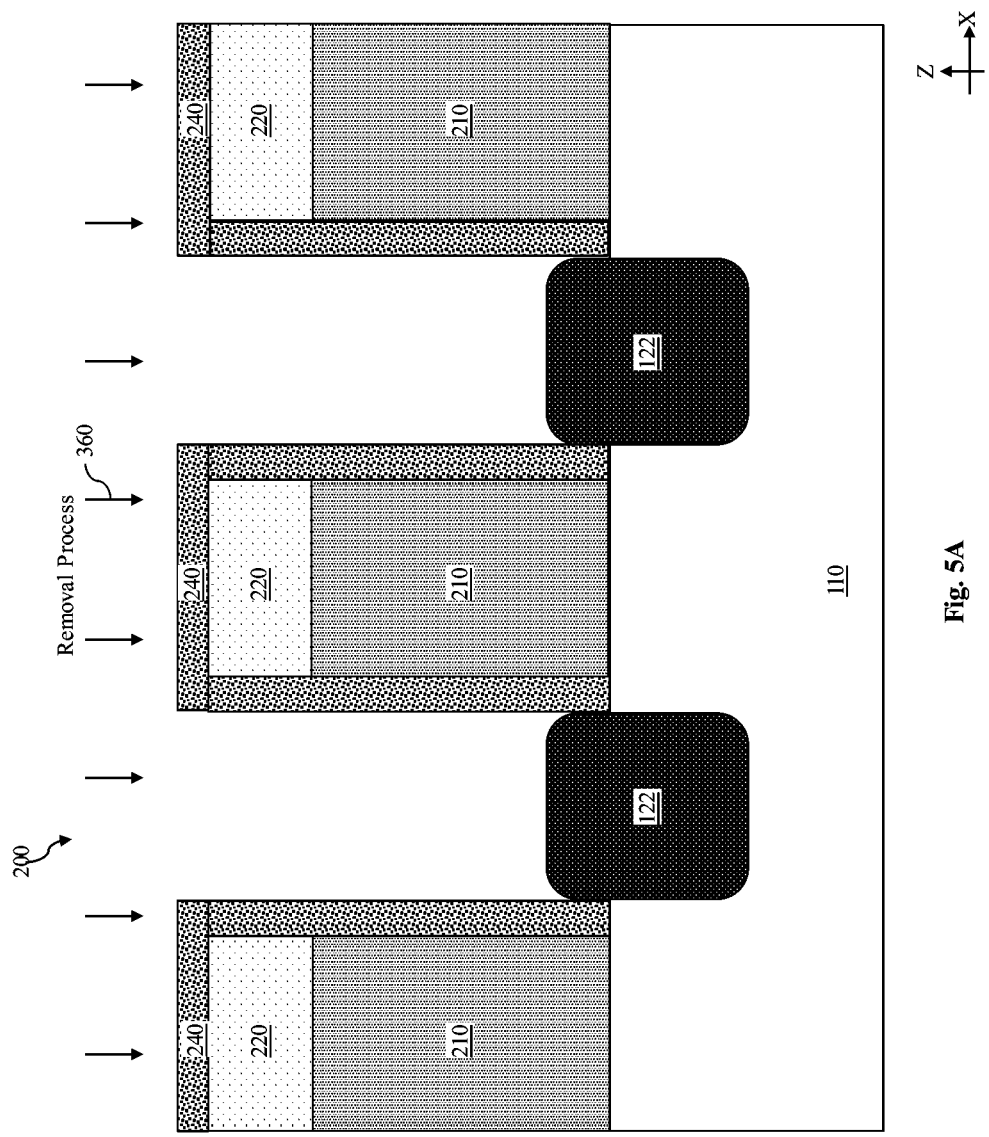
Figure 5B:
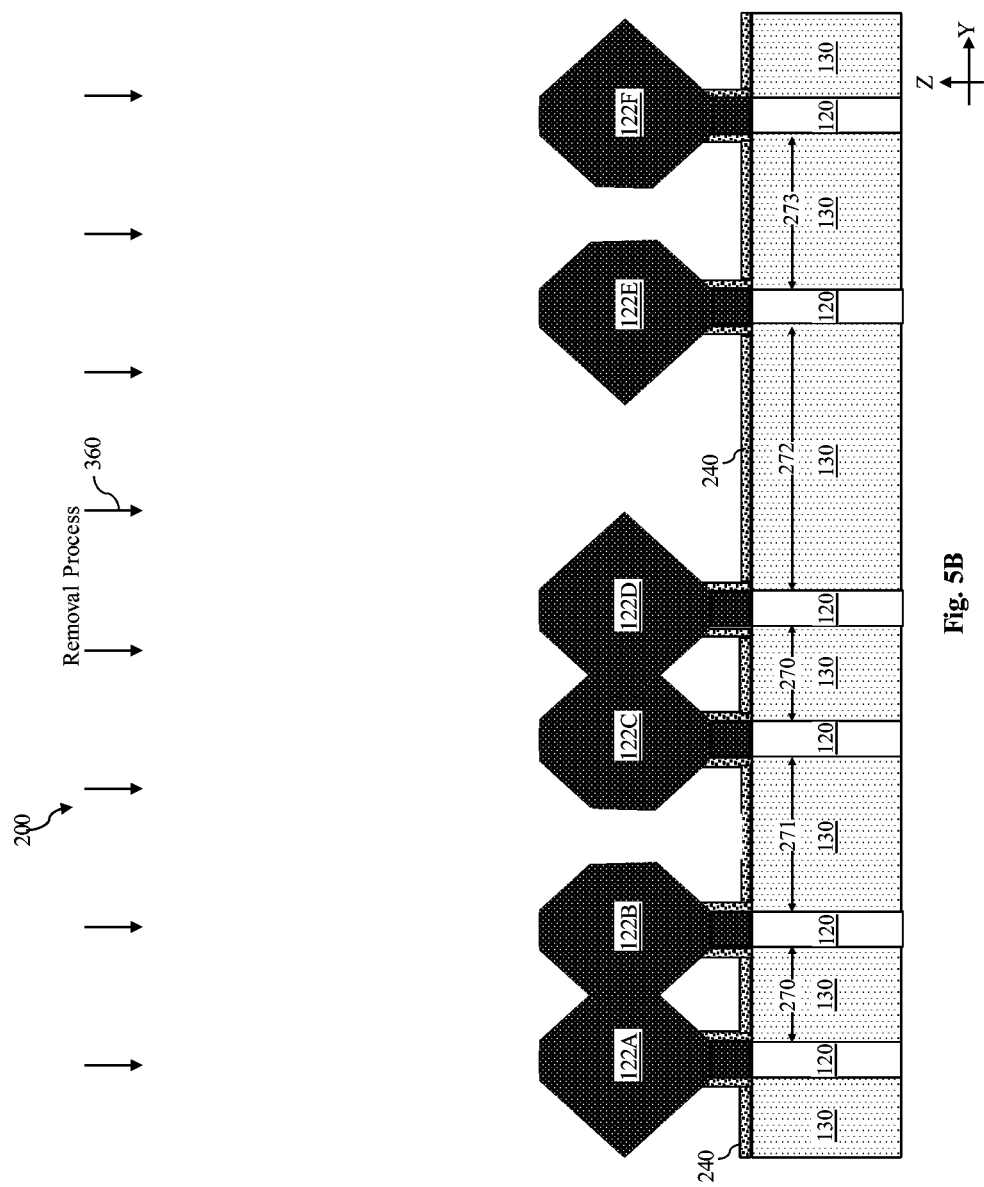

Referring now to FIGS. 5A-5B, a removal process 360 is performed to the IC device 200 to remove the sacrificial layer 310. In embodiments where the sacrificial layer 310 includes a photoresist material, the removal process 360 may include a photoresist stripping or ashing process. In embodiments where the sacrificial layer 310 includes a dielectric material, the removal process 360 may include one or more etching processes. As is shown in FIG. 5B, after the removal process 360 has been performed, the source/drain components 122B-122C are separated from one another, as are the source/drain components 122E-122F. Note that the source/drain components 122B, 122C, 122E, and 122F each have an asymmetrical profile as a result of being affected by the etching process 330. Such an asymmetrical profile is one of the unique physical characteristics of the IC device 200 of the present disclosure and will be discussed below in greater detail.

Figure 6A:
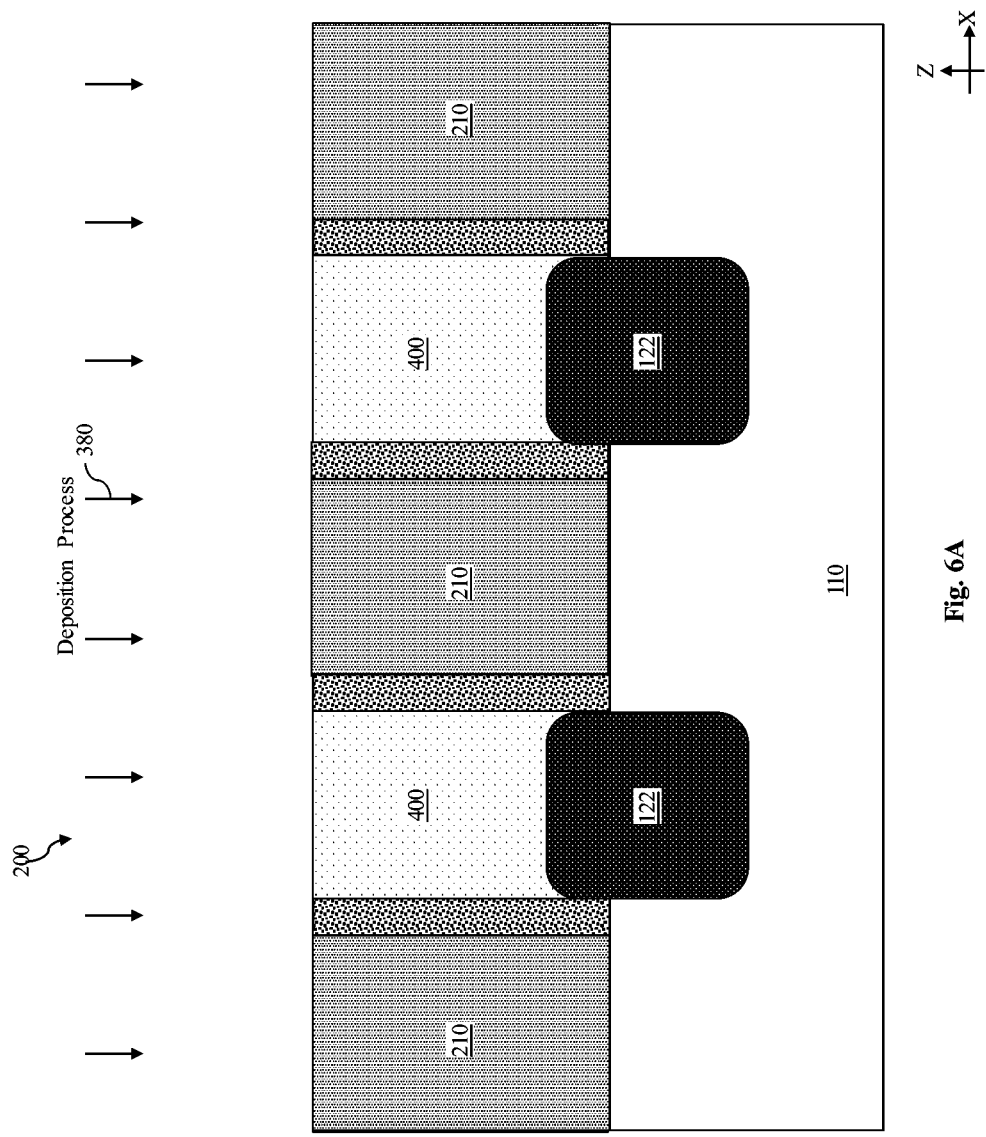
Figure 6B:
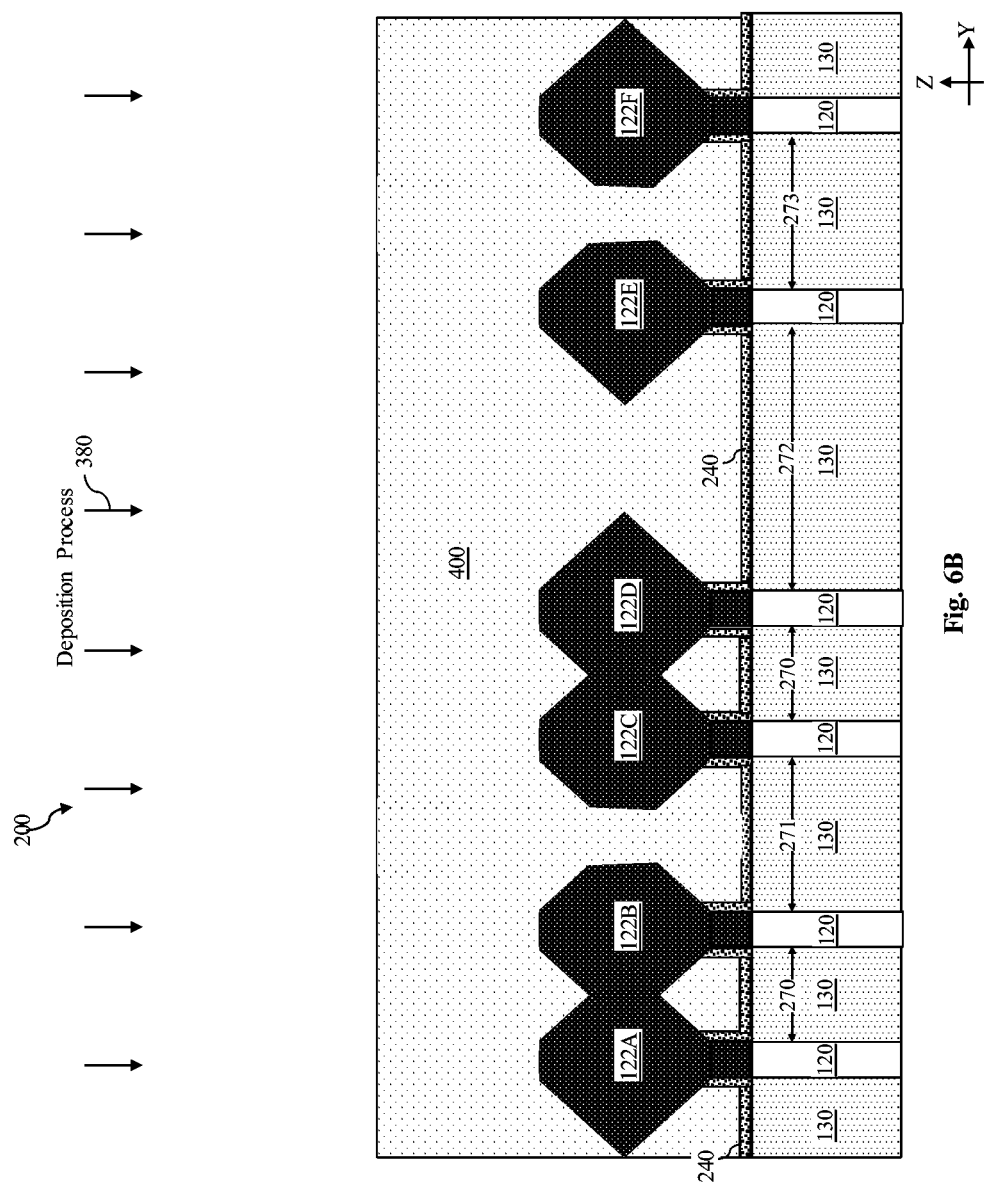

Referring now to FIGS. 6A-6B, a deposition process 380 is performed to the IC device 200 to form a dielectric layer 400. The deposition process 380 may include CVD, PVD, ALD, or combinations thereof. In some embodiments, the dielectric layer 400 is an interlayer dielectric (ILD), also referred to as an ILD0 layer. As non-limiting examples, the dielectric layer 400 may include a low-k dielectric (e.g., a dielectric material having a dielectric constant less than that of silicon oxide, which is about 3.9). In other embodiments, the dielectric layer 400 may include silicon oxide, silicon nitride, silicon carbide, or combinations thereof. As shown in FIG. 6B, the portions of the dielectric layer 400 disposed between the source/drain components 122B-122C provide physical and electrical isolation between them, and the portions of the dielectric layer 400 disposed between the source/drain components 122E-122F provide physical and electrical isolation between them as well.

Note that after the deposition process 380, a planarization process such as a chemical mechanical polishing (CMP) process may be performed to expose the dummy gate structures 210 and to planarize the upper surface of the dielectric layer 400. For example, as shown in FIG. 6A, the upper surfaces of the dummy gate structures 210 may be substantially coplanar with the upper surface of the dielectric layer 400.

Figure 7B:
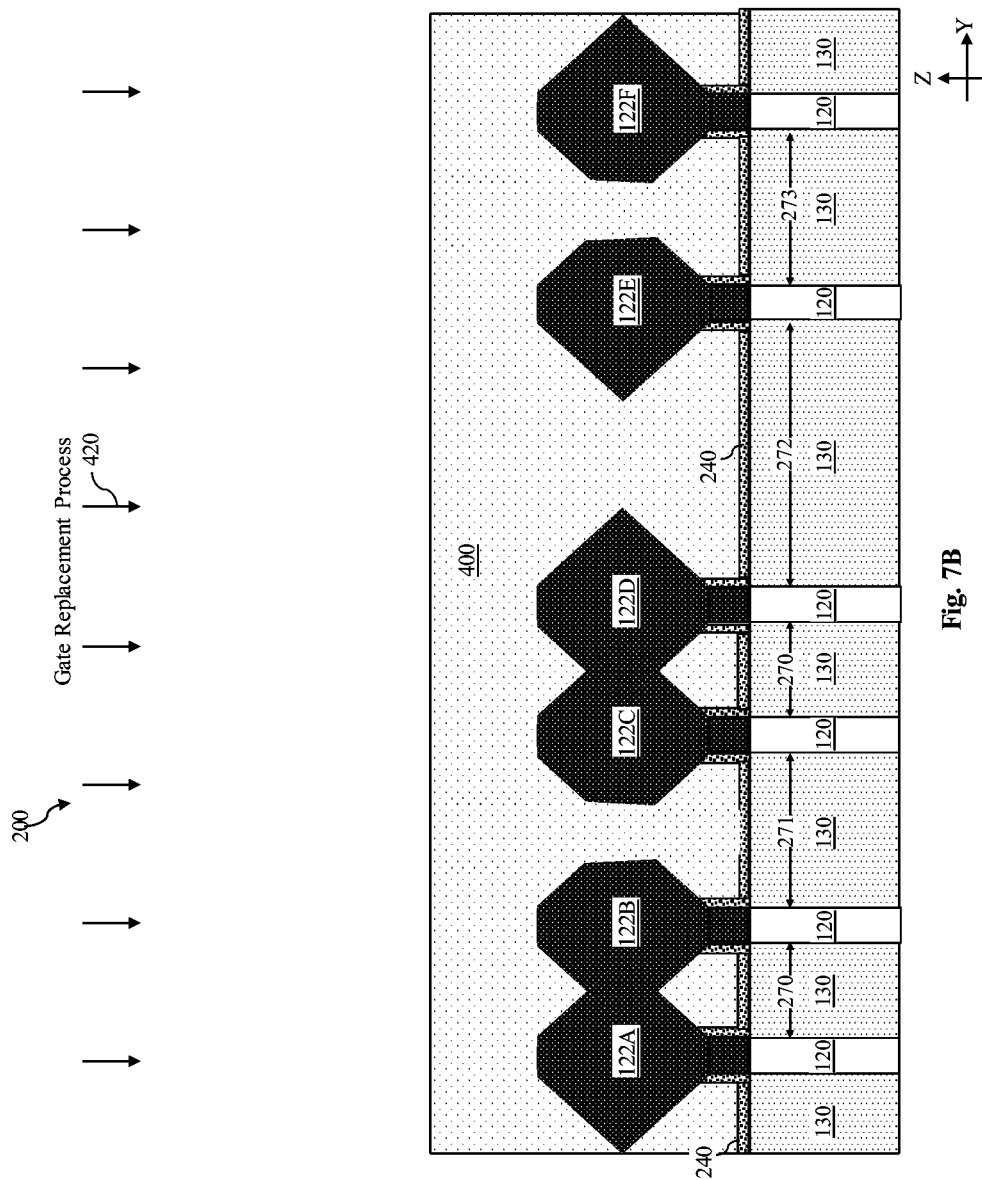

Referring now to FIGS. 7A-7B, a gate replacement process 420 is performed to the IC device 200 to replace the dummy gate structures 210 with high-k metal gate (HKMG) structures 440. The dummy gate structures 210 may be removed using etching processes, which leaves openings (trenches) in the dielectric layer 400. These openings or trenches are subsequently filled by the metal gate electrodes of the HKMG structures 440. In some embodiments, if the dummy gate structures 210 include a dummy gate dielectric layer (e.g., a silicon oxide gate dielectric), then the dummy gate dielectric layer will also be replaced by a high-k gate dielectric layer as a part of the HKMG structures 440. As such, HKMG structures 440 may each include a high-k gate dielectric and a metal gate electrode. Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. In some embodiments, the HKMG structures 440 may include additional layers, such as interfacial layers, capping layers, diffusion/barrier layers, or other applicable layers.

After the HKMG structures 440 are formed in the trenches to replace the dummy gate structures 210, etchback and CMP processes may also be performed to reduce the height of the HKMG structures 440 and the dielectric layer 400, as well as to planarize the upper surfaces of the HKMG structures 440 with the upper surfaces of the dielectric layer 400. Note that the HKMG structures 440 are not directly visible in FIG. 7B, since the cross-sectional cut shown in FIG. 7B is taken along the cutline B-B', which is outside of the HKMG structures 440.

Figure 8A:
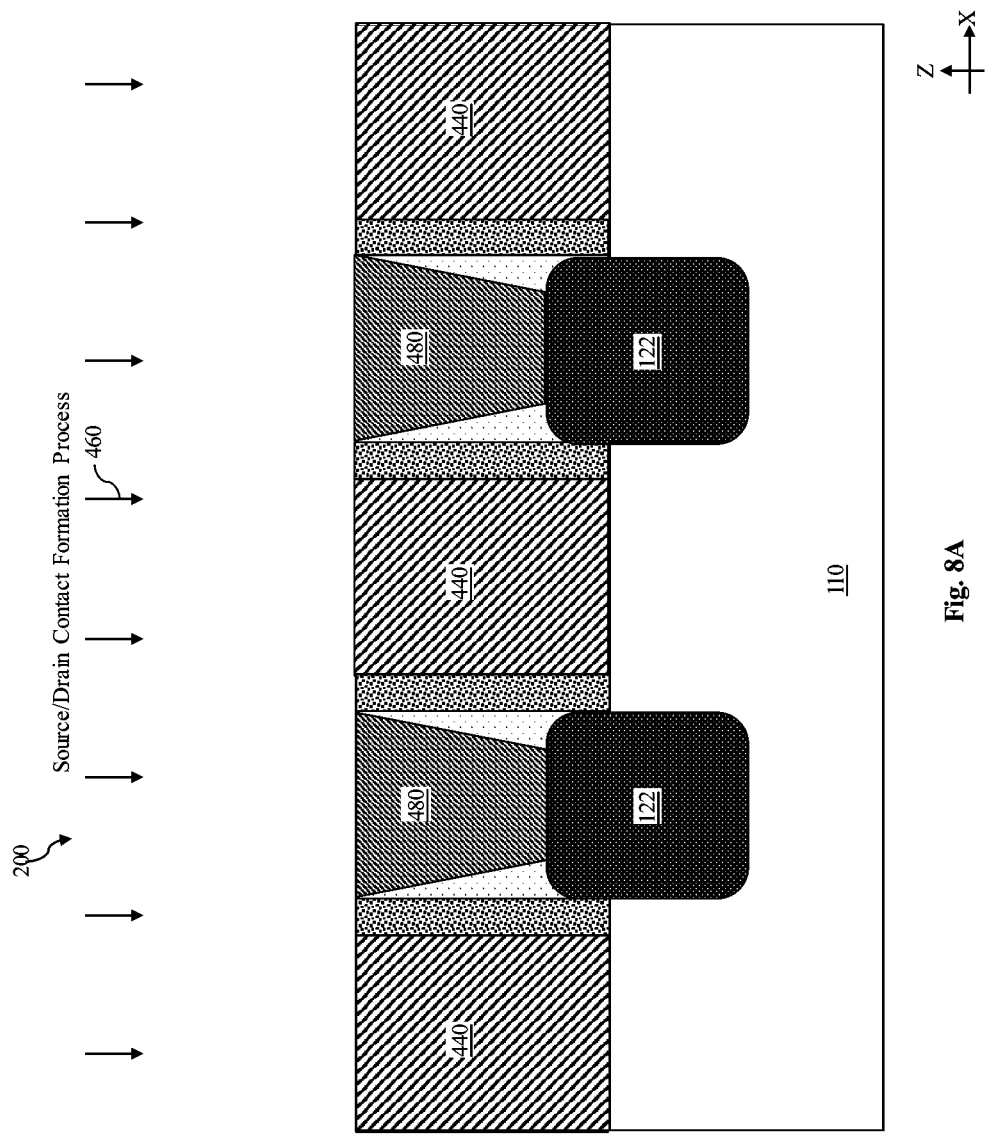
Figure 8B:
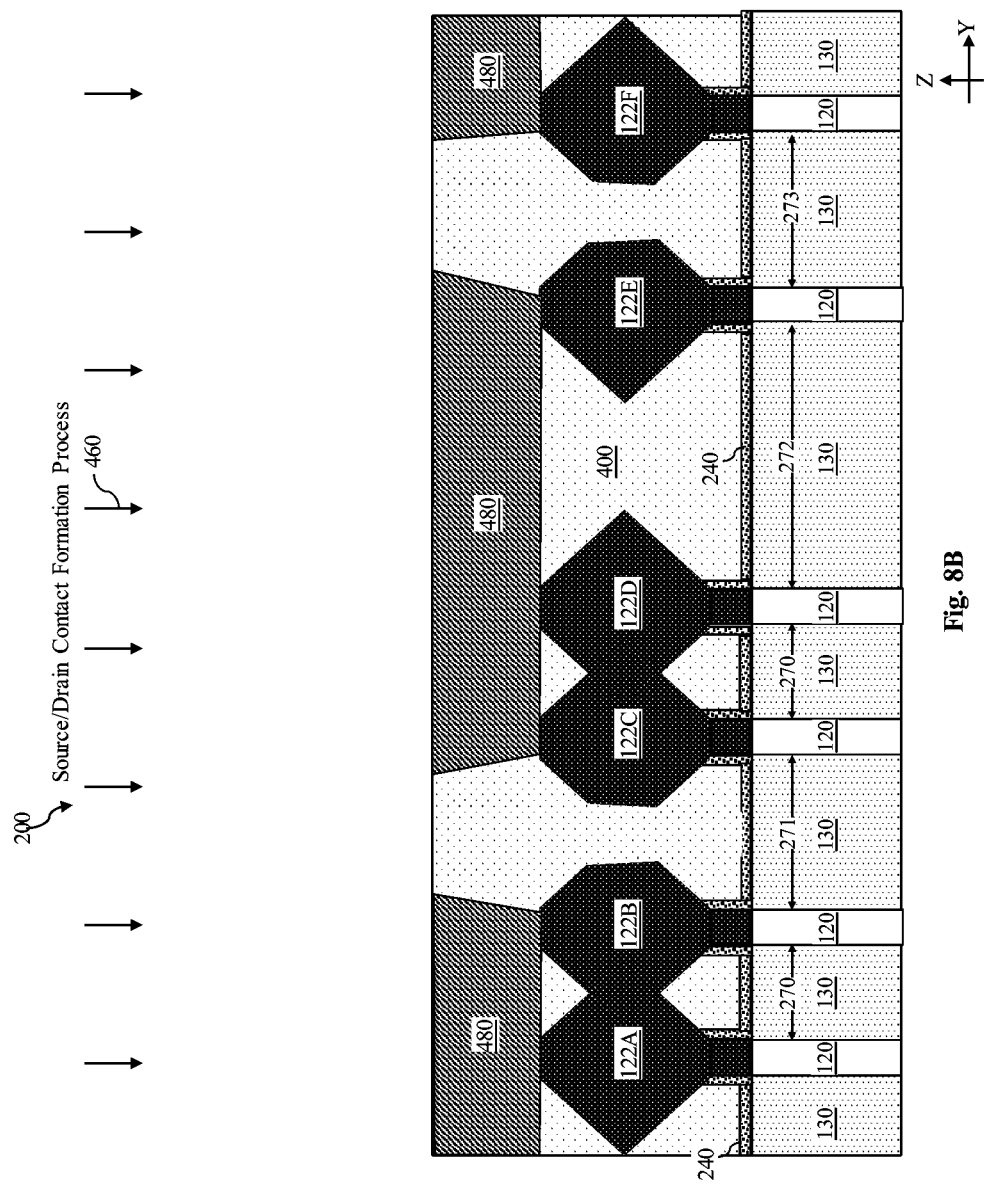

Referring now to FIGS. 8A-8B, a source/drain contact formation process 460 is performed to form source/drain contacts 480. For example, one or more etching processes may be performed to selectively remove portions of the dielectric layer 400 above the source/drain components 122A-122F, thereby forming source/drain contact trenches. A conductive material such as tungsten, titanium, cobalt, aluminum, copper, or combinations thereof may then may deposited to fill the source/drain contact trenches, thereby forming source/drain contacts 480. One of the source/drain contacts 480 electrically couples the source/drain components 122A-122B together, another one of the source/drain contacts 480 electrically couple the source/drain components 122C-122E together, and yet another of the source/drain contacts 480 is disposed over the source/drain component 122F.

Figure 9A:
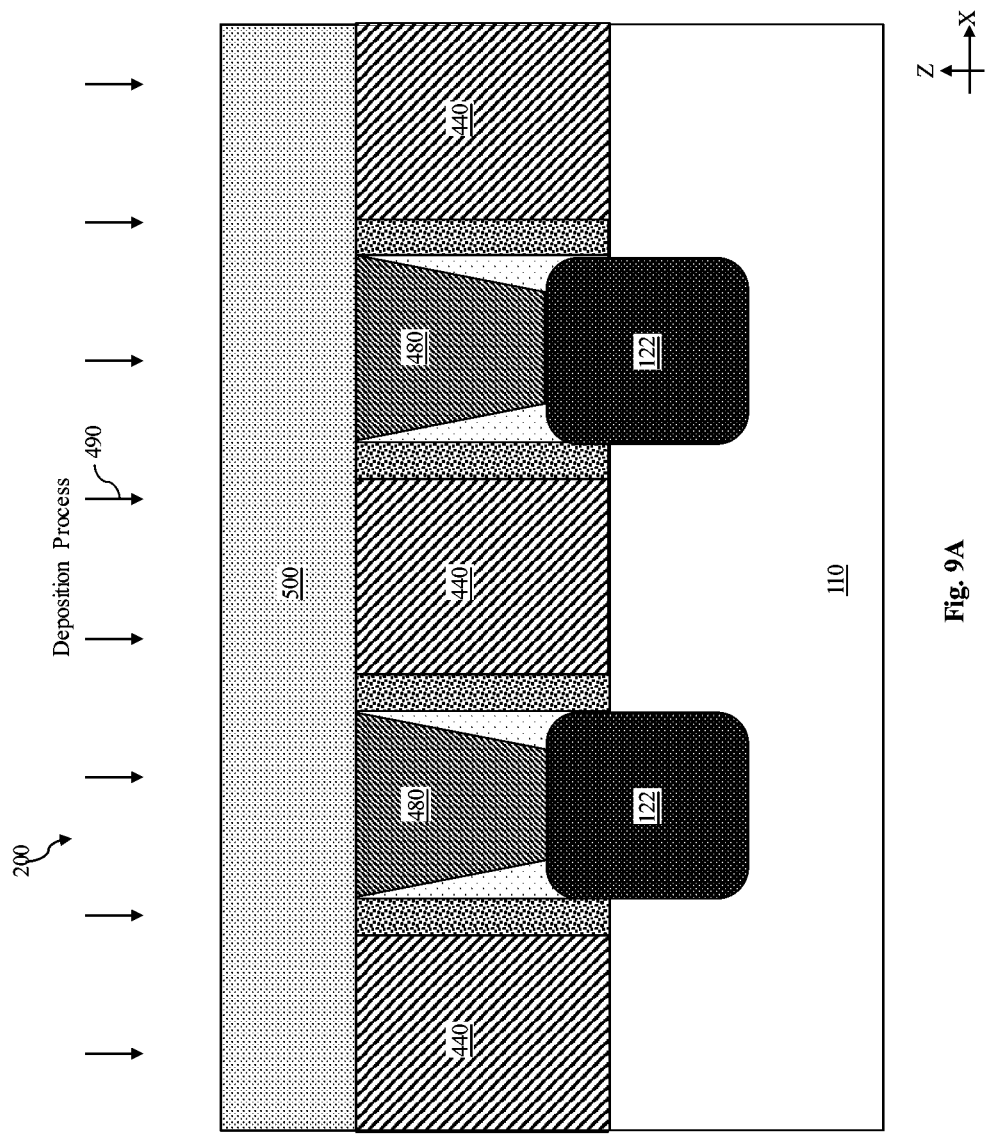
Figure 9B:
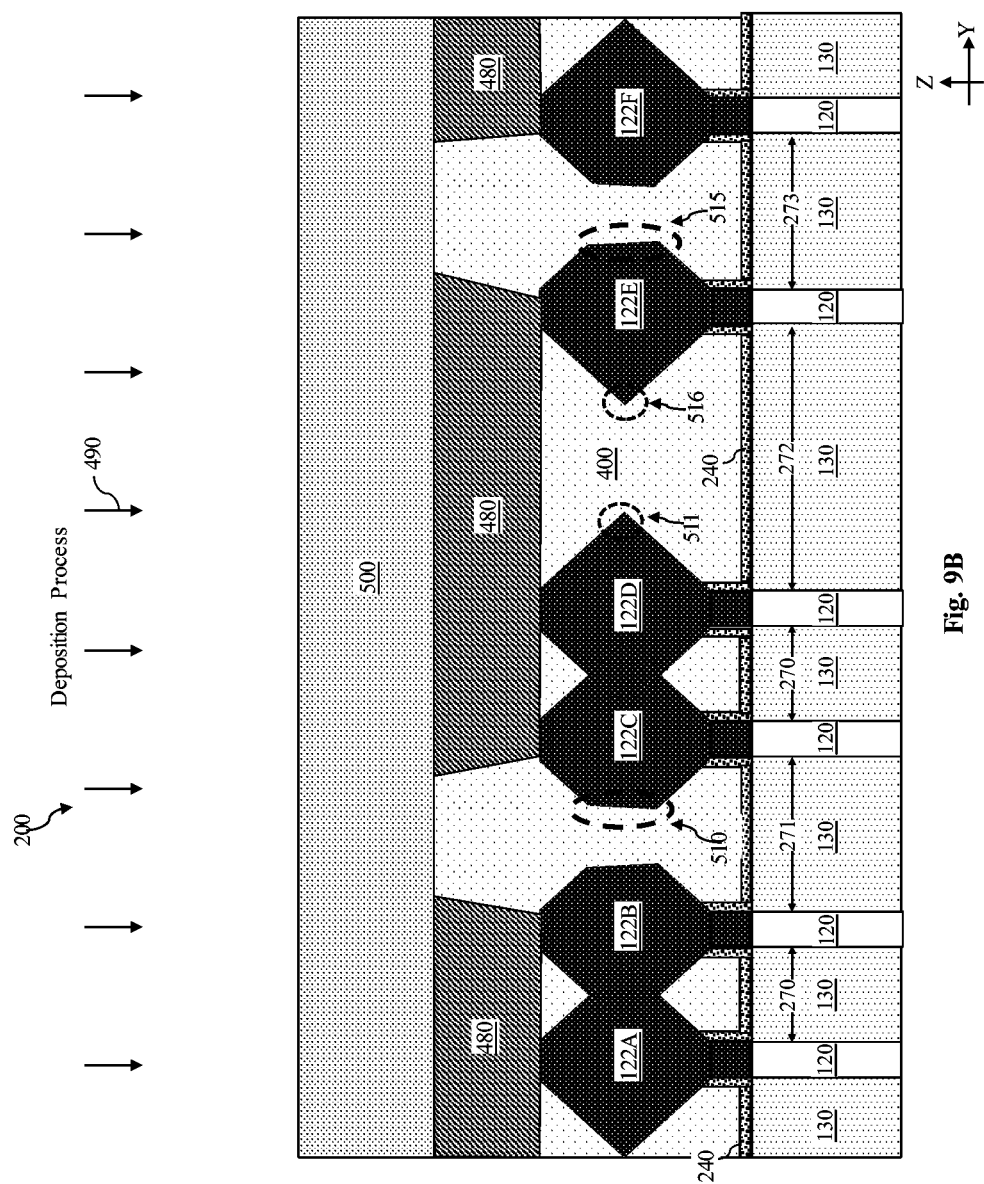

Referring now to FIGS. 9A-9B, a deposition process 490 is performed to form a dielectric layer 500 over the source/drain contacts 480 and over the HKMG structures 440. The deposition process 490 may include CVD, PVD, ALD, or combinations thereof. In some embodiments, the dielectric layer 500 is another interlayer dielectric, also referred to as an ILD1 layer, since it is disposed one level higher than the ILD0 layer. As non-limiting examples, the dielectric layer 500 may include a low-k dielectric, silicon oxide, silicon nitride, silicon carbide, or combinations thereof.

Additional fabrication processes may be performed subsequently to complete the fabrication of the IC device 200. For example, gate contacts and/or source/drain vias may be formed to extend through the dielectric layer 500 to provide electrical connectivity to the HKMG structures 440 and/or to the source/drain contacts 480, and additional metallization layers containing vias and metal lines may be formed over the dielectric layer 500. The IC device 200 may also undergo testing or packaging processes. For reasons of simplicity, these additional fabrication processes are not discussed in detail herein.

FIG. 9B demonstrates the unique physical characteristic of the IC device 200: the asymmetry of the source/drain components. For example, as shown in FIG. 9B, the source/drain component 122C has an outermost portion 510 on its "left side", and the source/drain component 122D has an outermost portion 511 on its "right side". The outermost portion 510 and the outermost portion 511 have different physical cross-sectional profiles, because the left side of the source/drain component 122C was etched by the etching process 330, but the right side of the source/drain component 122D was unetched by the etching process 330. In some embodiments, the outermost portion 510 may resemble a line, or a relatively flat edge, which may also be somewhat slanted, since the trench 340 (see FIG. 4B) is slanted or otherwise has a trapezoidal top-wide-bottom-narrow profile. In contrast, the outermost portion 511 has a relatively pointy profile, or at least a somewhat rounded protrusion, as a result of the epitaxial growth. As such, as a combined single structure, the source/drain components 122C/122D has an asymmetric profile, since the outermost portions 510 and 511 are shaped differently from one another. The same is true for the combined structure of the source/drain components 122A/122B as well. And in the case of the source/drain component 122E or 122F, they also each have one outermost portion 515 that is shaped as a line or a flat edge, and another outermost portion 516 that is shaped as a pointy tip or a rounded edge. In other words, the source/drain component 122E itself has an asymmetrical profile, as does the source/drain component 122F.

However, it is understood that the asymmetrical profile is not required for IC devices manufactured according to the present disclosure. In some embodiments of the present disclosure, both the "left" and "right" sides of a source/drain component (or multiple source/drain components merged together) may be etched, and therefore the resulting structure may have symmetrical source/drain components, where both the left outermost portion and the right outermost portion are shaped as lines or relatively flat edges.

The discussions above with reference to FIGS. 2A-2B through FIGS. 9A-9B pertain to a first embodiment of the present disclosure, in which the merged source/drain components 122 are broken up before the ILD0 (i.e., the dielectric layer 400) is formed. FIGS. 10A-10B through FIGS. 13A-13B pertain to a second embodiment of the present disclosure, in which the merged source/drain components 122 are broken up after the formation of the dielectric layer 400 (i.e., the ILD0), but before the HKMG structures 440 are formed. This second embodiment of the present disclosure will now be discussed below in more detail. For reasons of consistency and clarity, similar components appearing in the first embodiment and the second embodiment will be labeled the same.

Figure 10A:
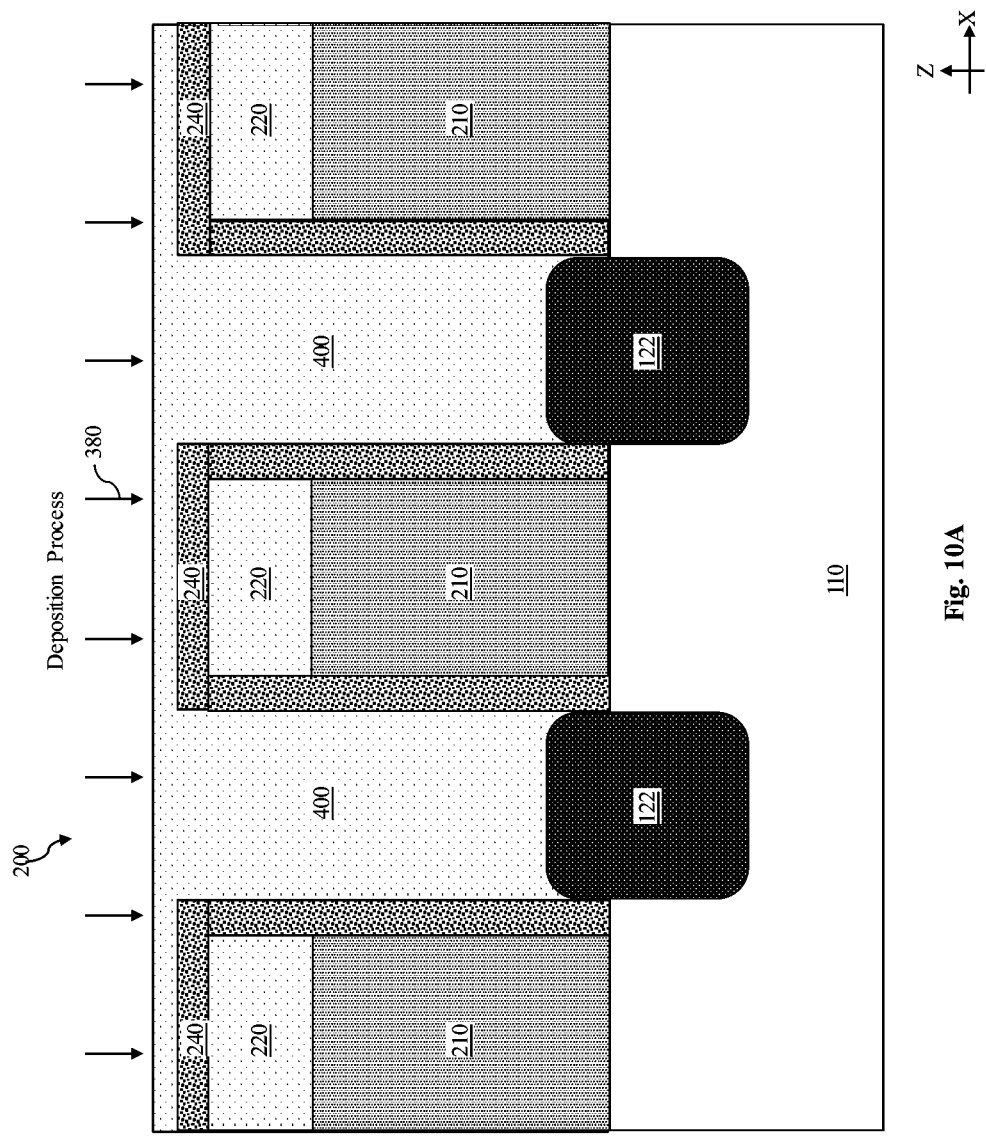
Figure 10B:
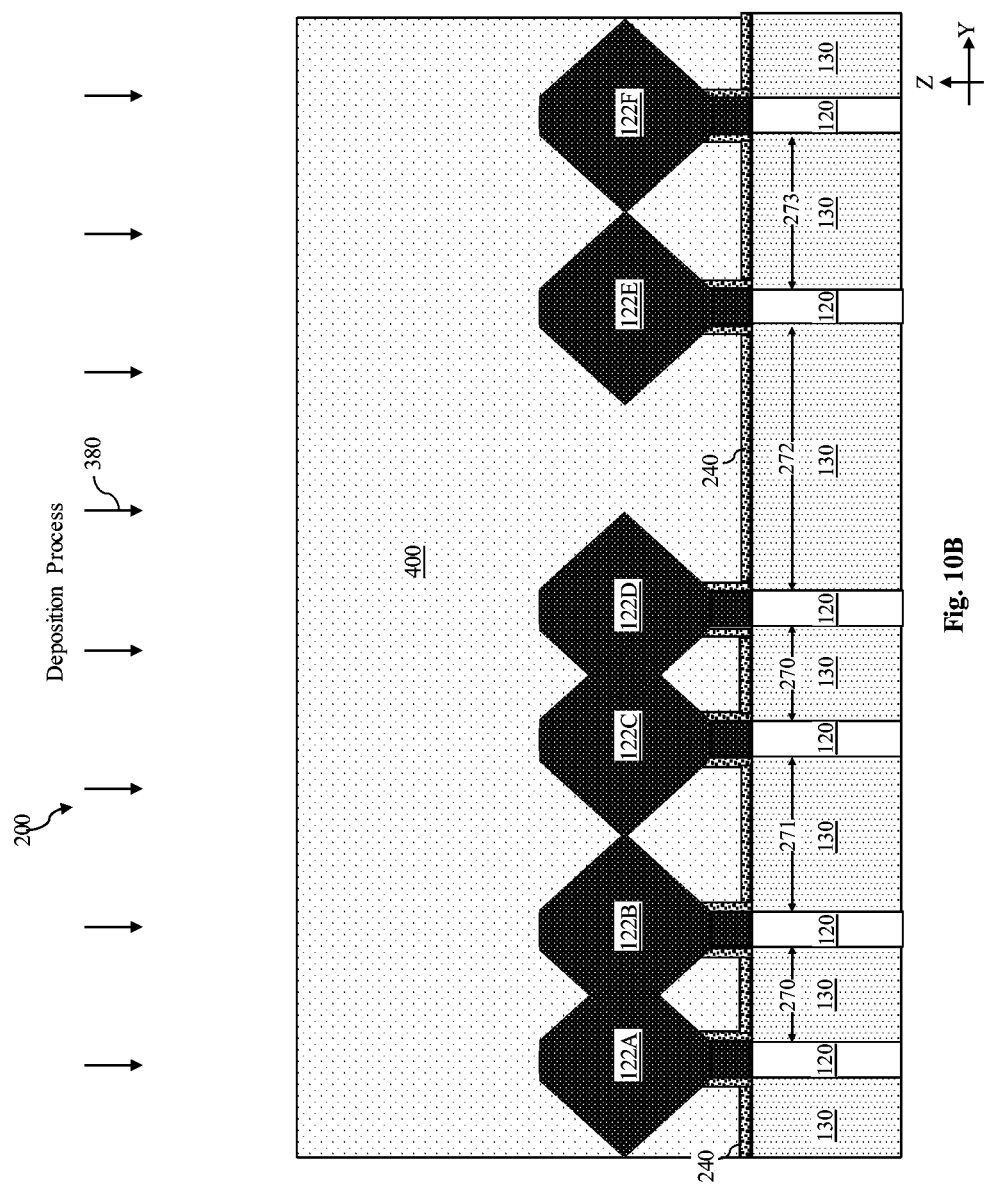

Referring now to FIGS. 10A-10B, the source/drain components 122 have been epitaxially grown using the epitaxial growth process 260 discussed above with reference to FIGS. 2A-2B. Thereafter, instead of forming the sacrificial layer 310 (as is done in the first embodiment), the second embodiment performs the deposition process 380 to form the dielectric layer 400 (i.e., the ILD0). At this stage of fabrication, the merged source/drain components 122A-122B, 122C-122D, and 122E-122F are not broken up yet. The dielectric layer 400 is formed around the source/drain components 122A-122E, as shown in FIG. 10B.

Figure 11A:
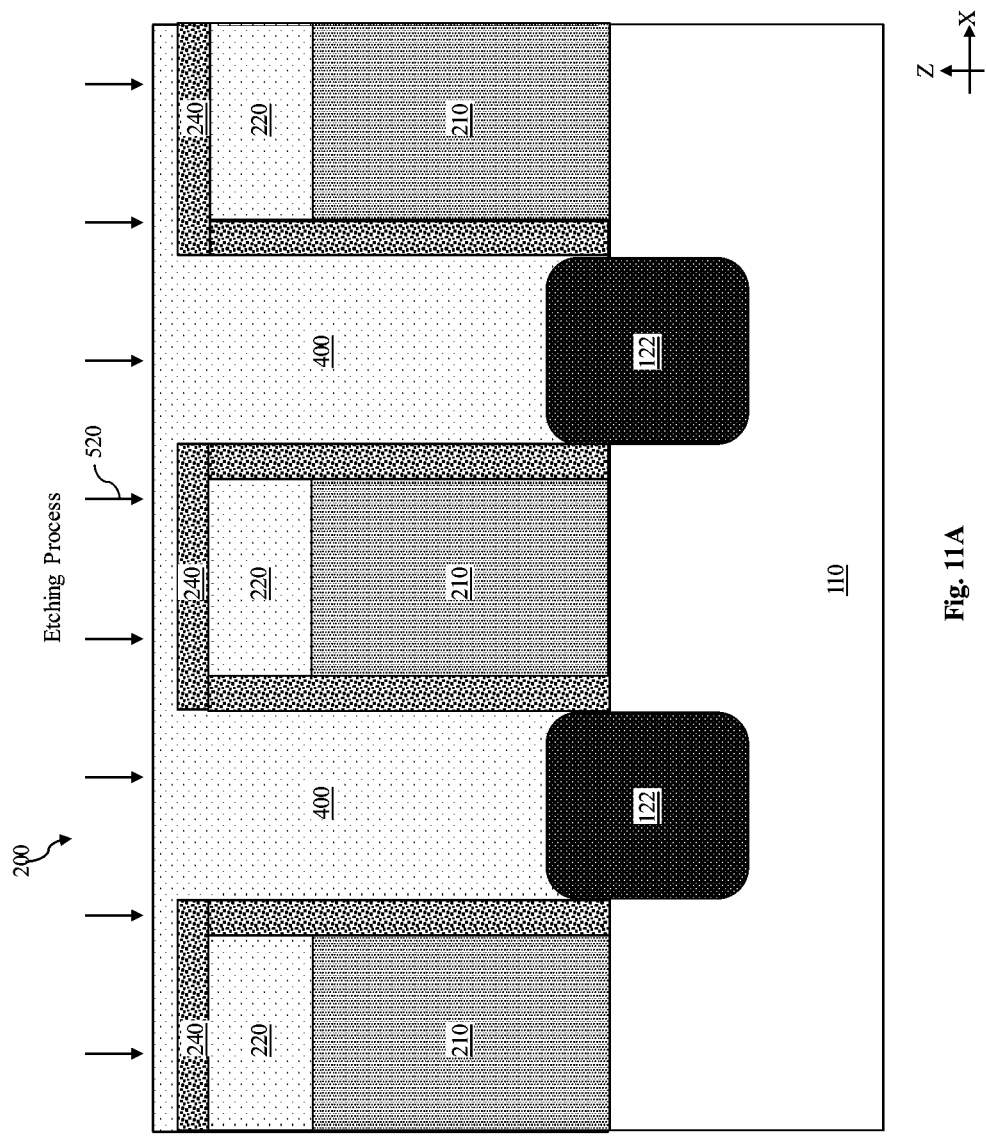
Figure 11B:
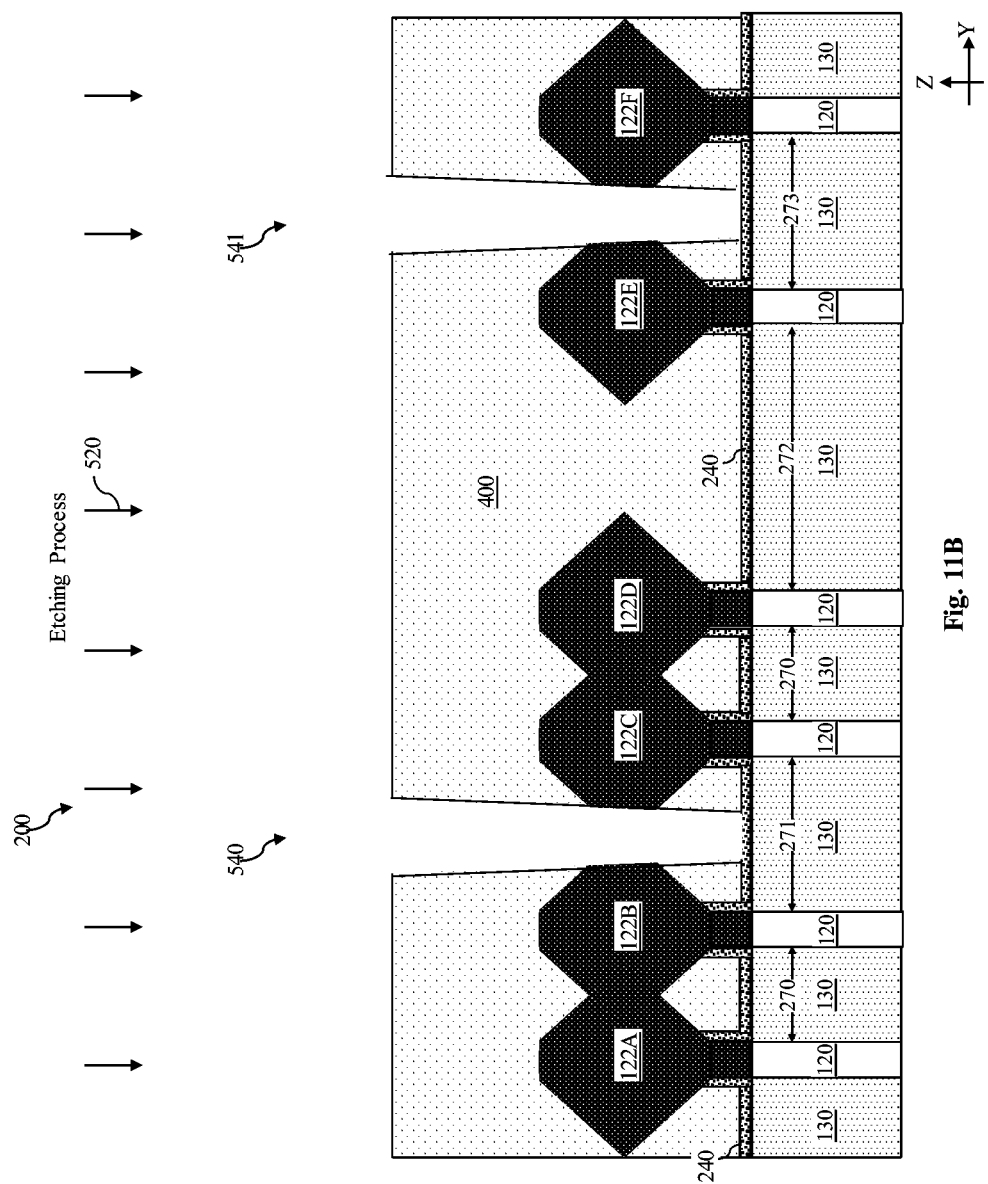

Referring now to FIGS. 11A-11B, an etching process 520 is performed to form openings 540 and 541. The opening 540 extends vertically through the dielectric layer 400 and "breaks up" the merged portions of the source/drain components 122B-122C of the NFETs. The opening 541 extends vertically through the dielectric layer 400 and "breaks up" the merged portions of the source/drain components 122E-122F of the PFETs. In other words, the etching process 520 also removes portions of the source/drain components 122B-122C and 122E-122F, such that they are no longer in physical contact with each other. Note that due to the location of the cross-sectional cut of FIG. 11A, the openings 540-541 are not directly visible in FIG. 11A.

It is understood that, compared to the openings 340-341 of the first embodiment (etched vertically through the sacrificial layer 310, as shown in FIG. 4B), the openings 540-541 have a shorter height and a smaller aspect ratio, where the aspect ratio refers to a ratio of a height (in the Z-direction) of an opening and a width (in the Y-direction) of the opening. The smaller aspect ratio makes process control a little easier, for example in terms of controlling the location of the openings 540-541.

Figure 12A:
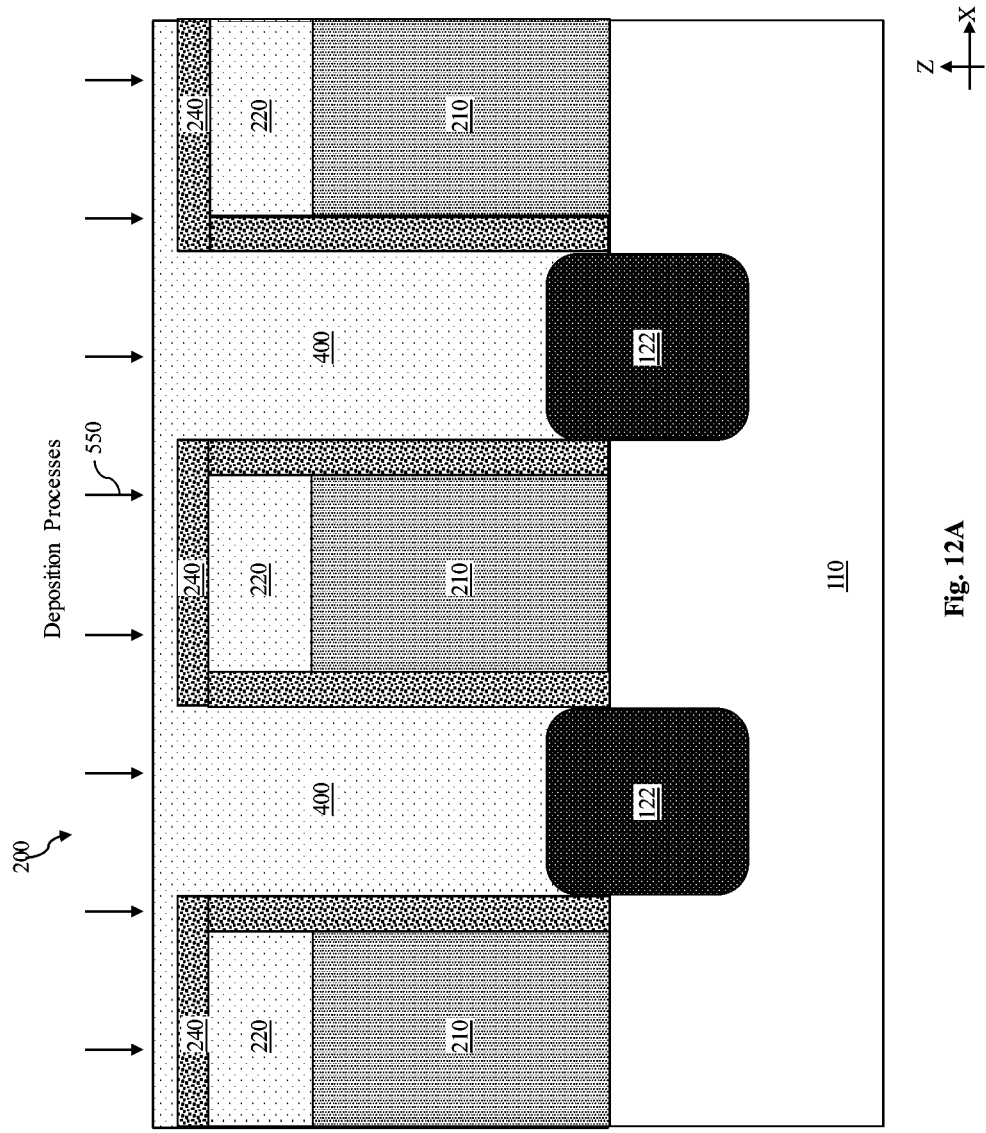
Figure 12B:
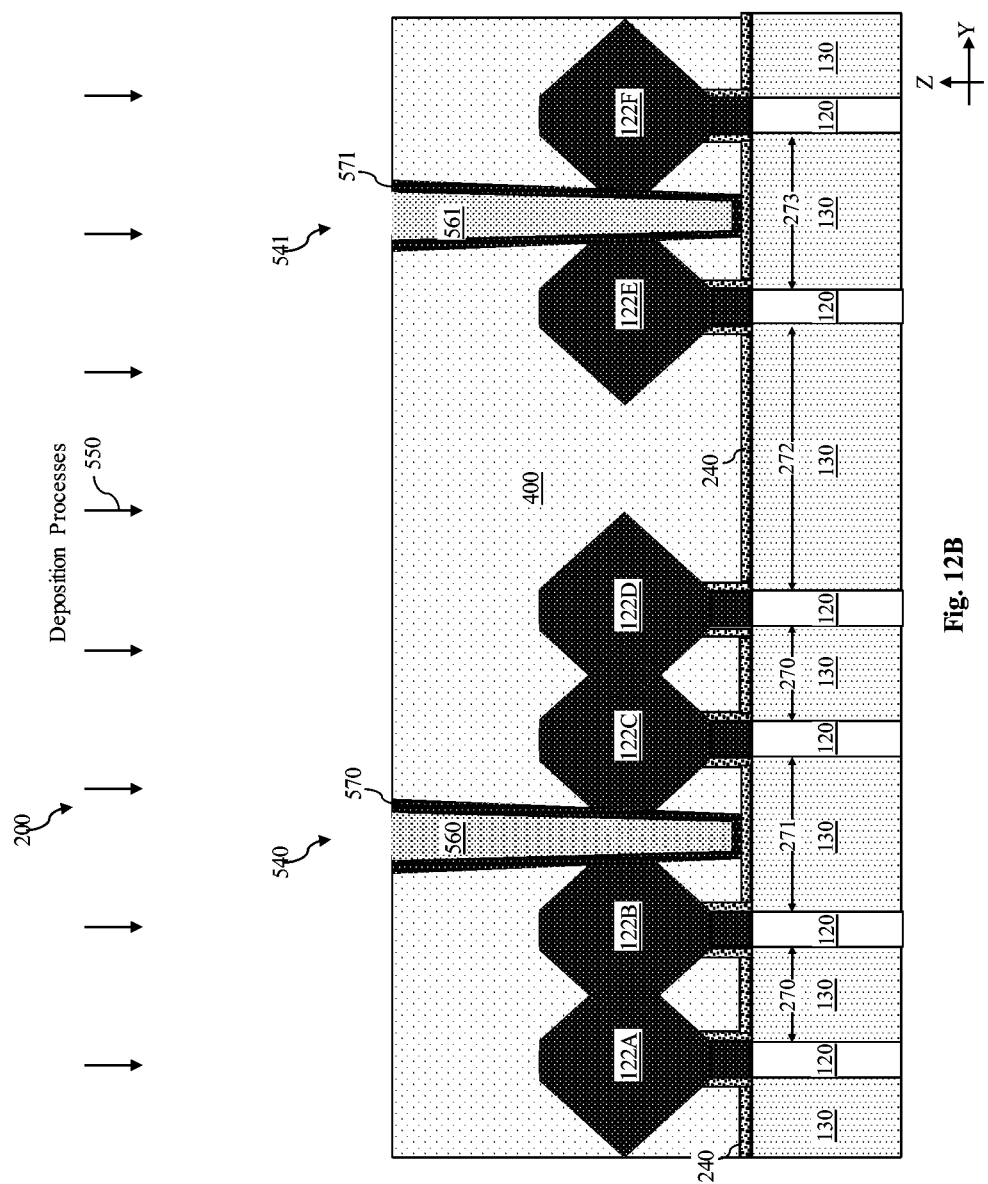

Referring now to FIGS. 12A-12B, one or more deposition processes 550 is performed to the IC device 200 to form isolation structures 560 and 561 in the openings 540 and 541, respectively. The deposition process 550 may include a CVD process, a PVD process, an ALD process, or combinations thereof. The isolation structures 560 and 561 may include a dielectric material, for example silicon nitride. In some embodiments, such as in the illustrated embodiment, the isolation structures 560 and 561 may include liners 570 and 571, respectively. In other words, the liners 570 and 571 are deposited by the deposition processes 550 into the openings 540 and 541 first. The rest of the isolation structures 560 and 561 are then deposited into the openings 540 and 541 thereafter, on the liners 570 and 571, respectively. In such a "dual-layer" scheme, the liners 570 and 571 may include a dielectric material having good adhesion properties, and the rest of the isolation structures 560 and 561 may include a material having a fast gap filling performance. In some embodiments, the liners 570 and 571 may include silicon oxide, while the rest of the isolation structures 560 and 561 may include silicon nitride.

Regardless of whether the isolation structures 560 and 561 are implemented with a single-layer scheme or with a dual-layer scheme, they effectively provide electrical and physical separation between the source/drain components 122B-122C and between the source/drain components 122E-122F. As such, undesirable merging between the adjacent source/drain components are prevented.

Figure 13A:
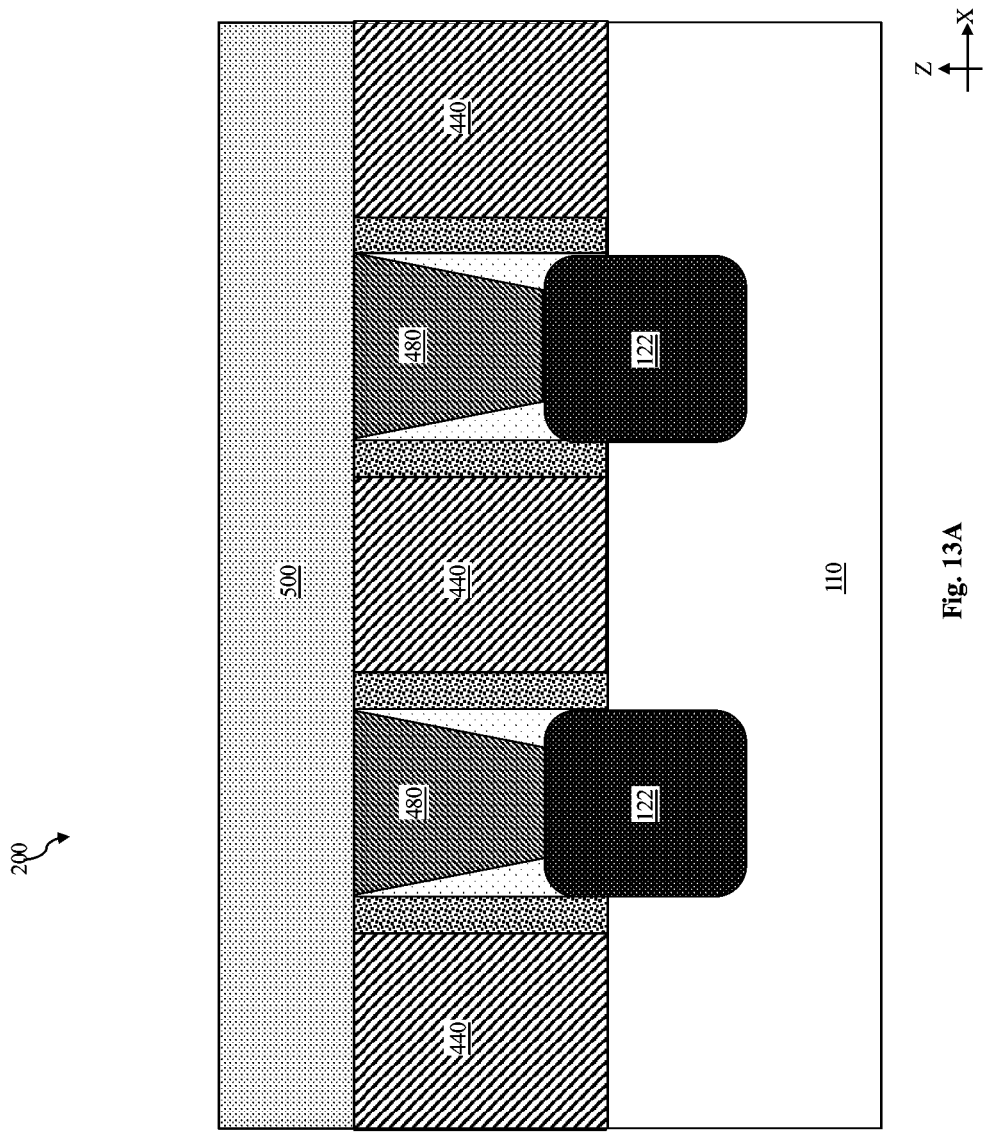
Figure 13B:
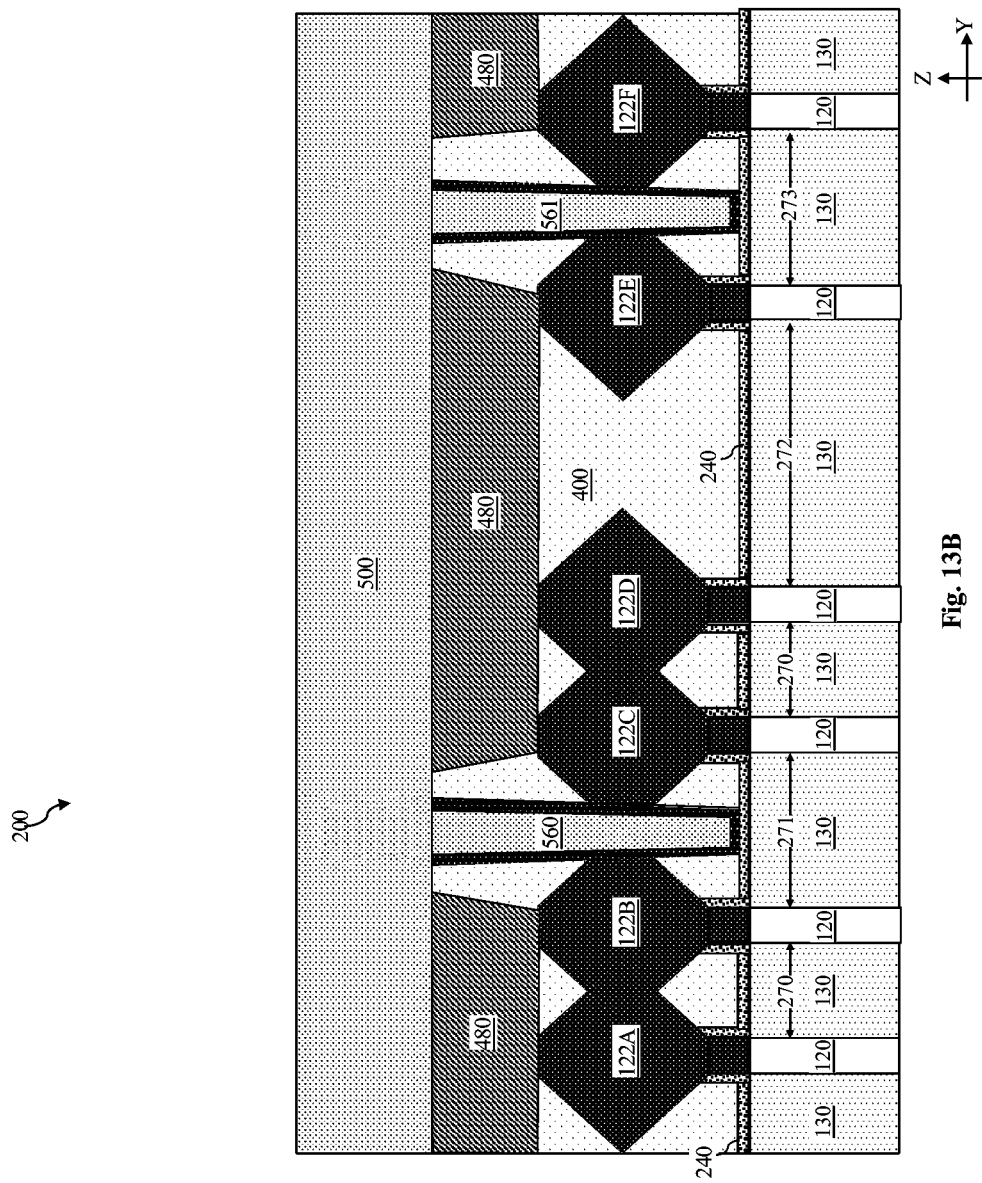

Referring now to FIGS. 13A-13B, the processes discussed above with reference to FIGS. 7A-9A and 7B-9B are performed to the IC device 200, including the gate replacement process 420 to replace the dummy gate structures 210 with the HKMG structures 440, the source/drain contact formation process 460 to form the source/drain contacts 480, and the deposition process 490 to form the dielectric layer 500 (i.e., the ILD1). Since these processes have already been discussed above in detail with respect to the first embodiment, they are not repeated herein for the second embodiment.

FIGS. 14A-17A and 14B-17B pertain to a third embodiment of the present disclosure, in which the merged source/drain components 122 are broken up after the HKMG structures 440 are formed to replace the dummy gate structures 210, but before the source/drain contacts 480 are formed. This third embodiment of the present disclosure will now be discussed below in more detail. For reasons of consistency and clarity, similar components appearing in the first, second, and third embodiments will be labeled the same.

Figure 14A:
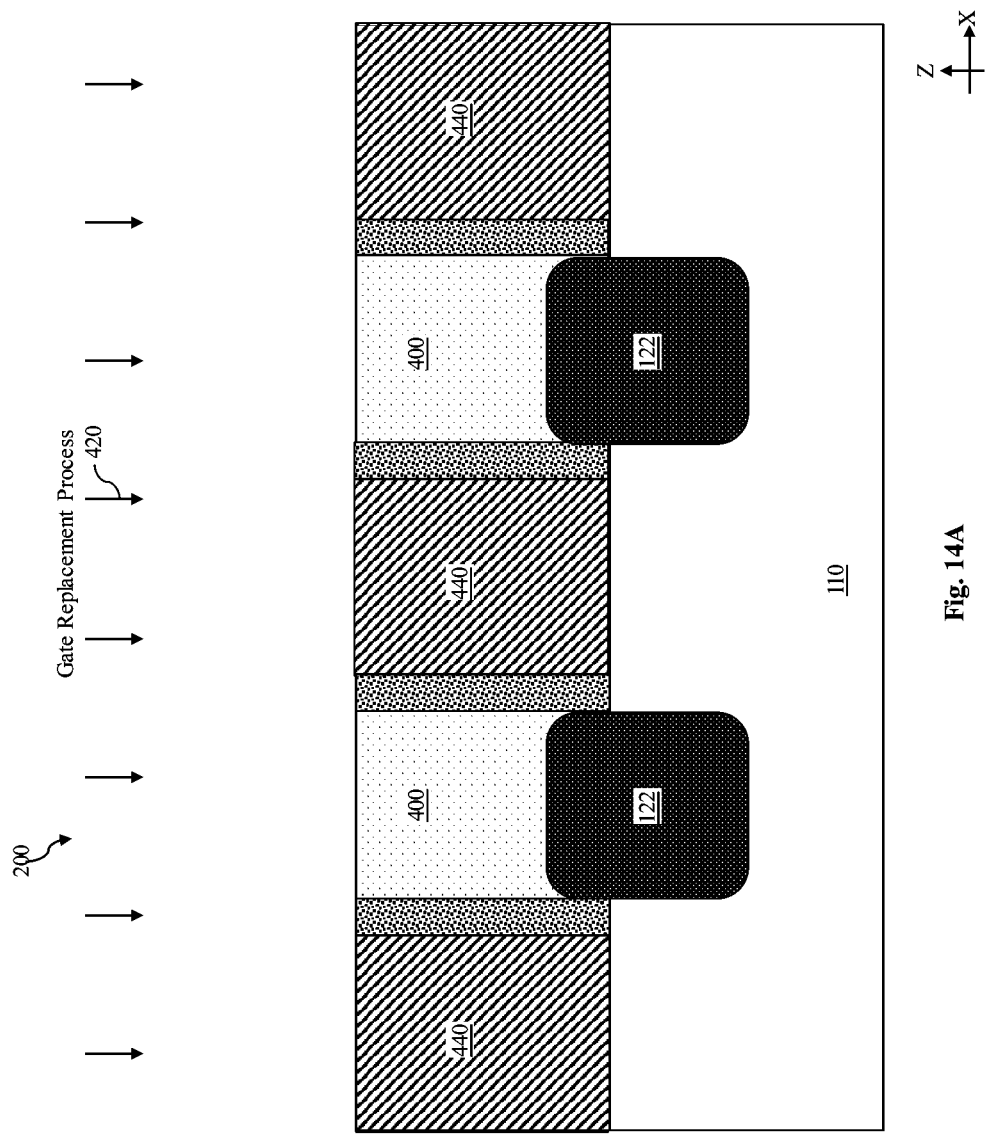
Figure 14B:
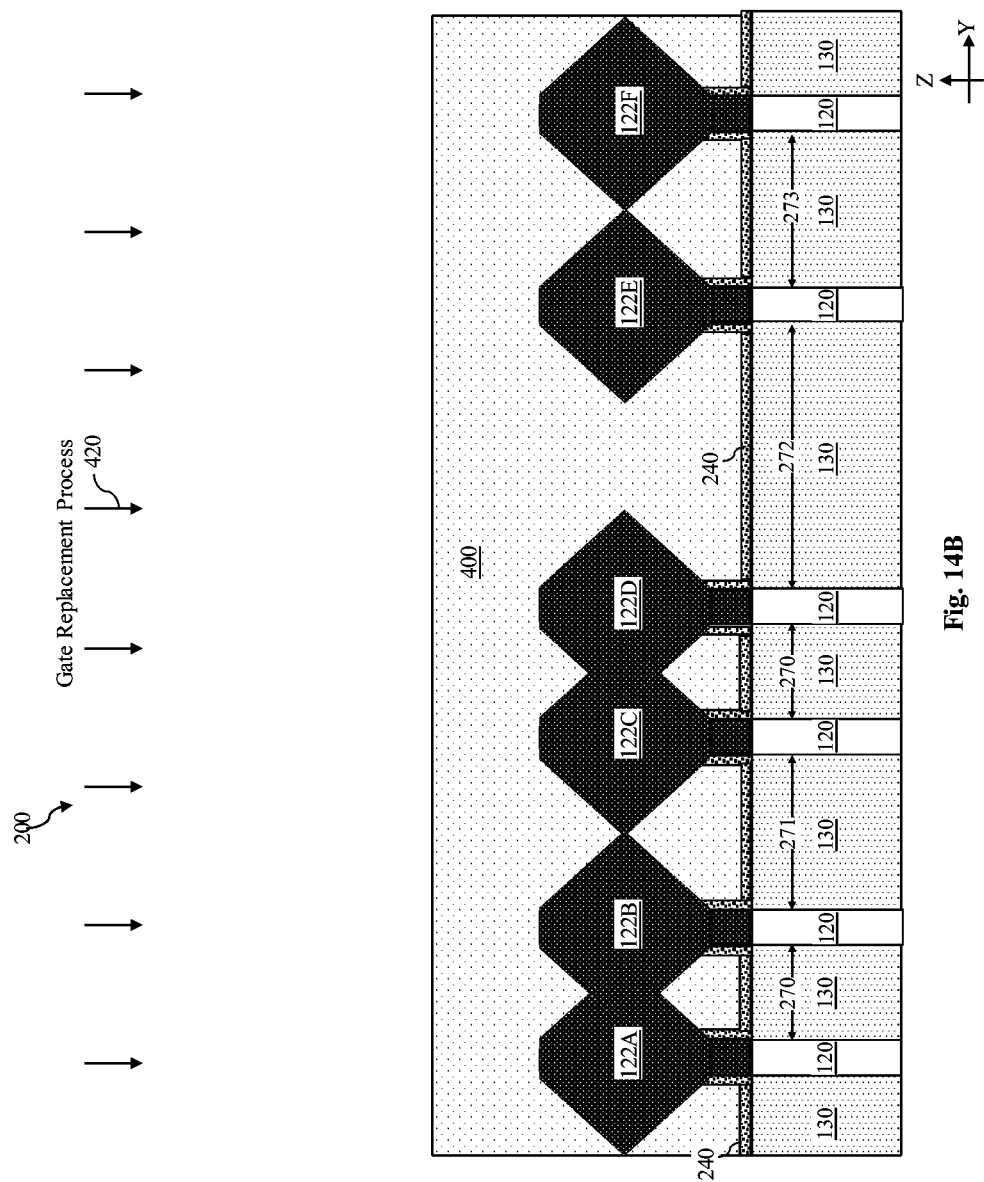

Referring now to FIGS. 14A-14B, the source/drain components 122 have been epitaxially grown using the epitaxial growth process 260 discussed above with reference to FIGS. 2A-2B. As is done in the second embodiment discussed above, the third embodiment performs the deposition process 380 to form the dielectric layer 400 (i.e., the ILD0). The gate replacement process 420 is then performed to replace the dummy gate structures 210 with the HKMG structures 440. At this stage of fabrication, the merged source/drain components 122A-122B, 122C-122D, and 122E-122F are not broken up yet, as shown in FIG. 14B.

Figure 15B:
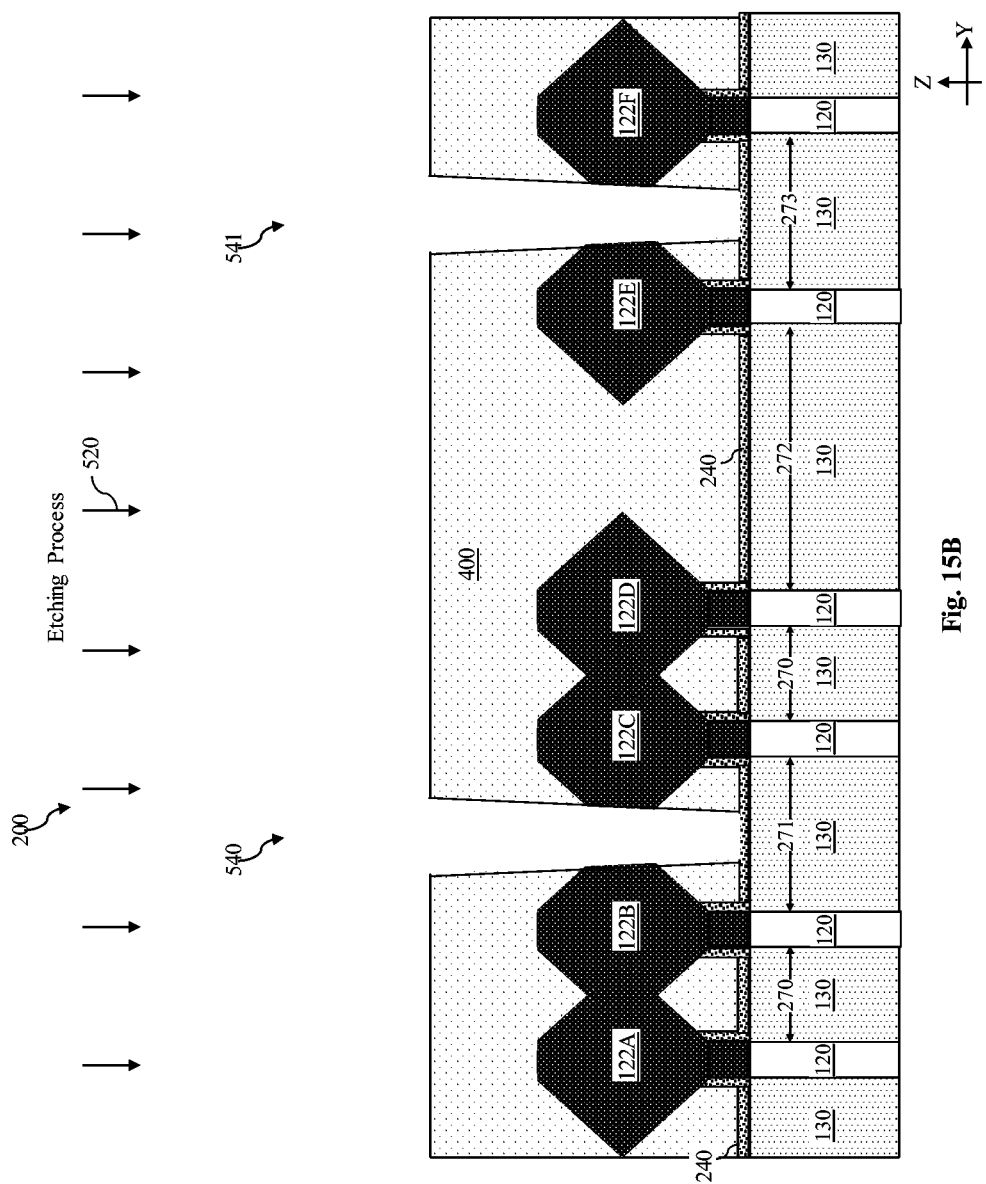

Referring now to FIGS. 15A-15B, the etching process 520 discussed above is performed to form the openings 540 and 541 that extend vertically through the dielectric layer 400. Again, the opening 540 "breaks up" the merged portions of the source/drain components 122B-122C of the NFETs, and the opening 541 "breaks up" the merged portions of the source/drain components 122E-122F of the PFETs. The openings 540-541 also have a smaller aspect ratio than the openings 340-341 of the first embodiment, and the smaller aspect ratio allows for better process control. Again, due to the location of the cross-sectional cut of FIG. 15A, the openings 540-541 are not directly visible in FIG. 15A.

Figure 16A:
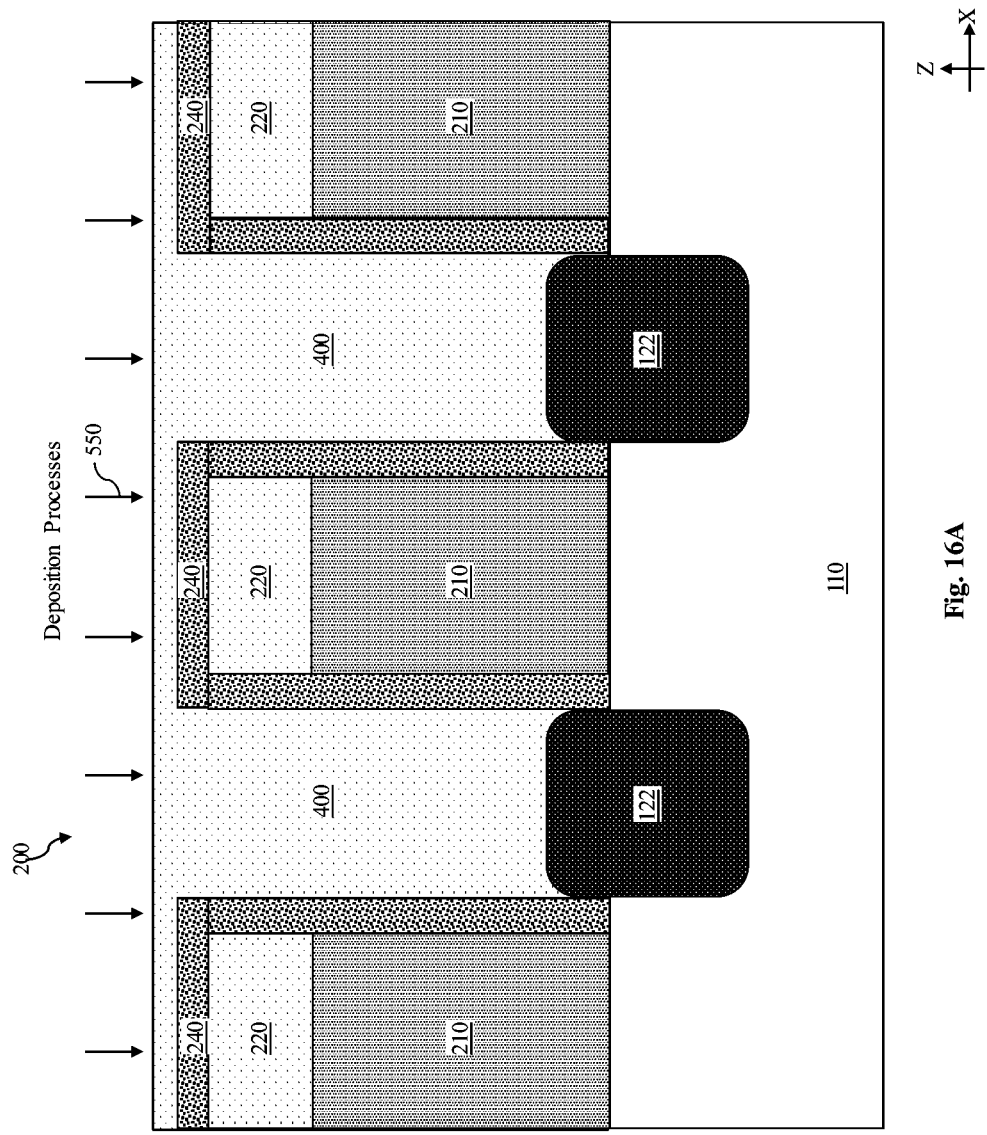
Figure 16B:
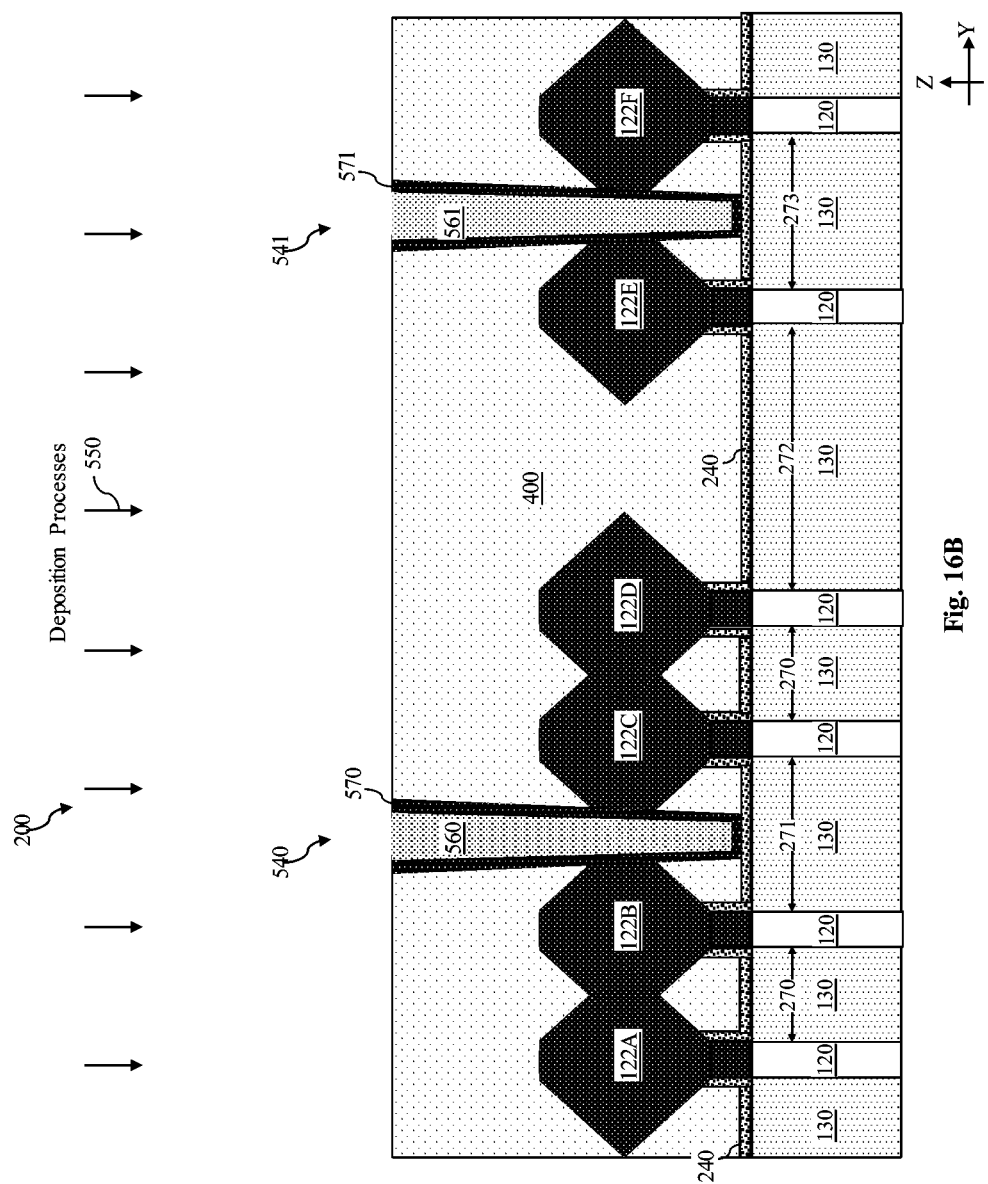

Referring now to FIGS. 16A-16B, the one or more deposition processes 550 discussed above is performed to the IC device 200 to form isolation structures 560 and 561 in the openings 540 and 541, respectively. The deposition process 550 may include a CVD process, a PVD process, an ALD process, or combinations thereof. The isolation structures 560 and 561 may include a dielectric material, for example silicon nitride, silicon oxide, silicon oxynitride, silicon carbon oxynitride, silicon carbide, a high-k dielectric material (e.g., hafnium oxide), or a low-k dielectric material (e.g., a porous material). Also, as discussed above, the isolation structures 560 and 561 may include the liners 570 and 571, respectively, which could be made of a different material than the rest of the isolation structures 560 and 561. In any case, the isolation structures 560 and 561 effectively provide electrical and physical separation between the source/drain components 122B-122C and between the source/drain components 122E-122F. As such, undesirable merging between the adjacent source/drain components are prevented.

Figure 17A:
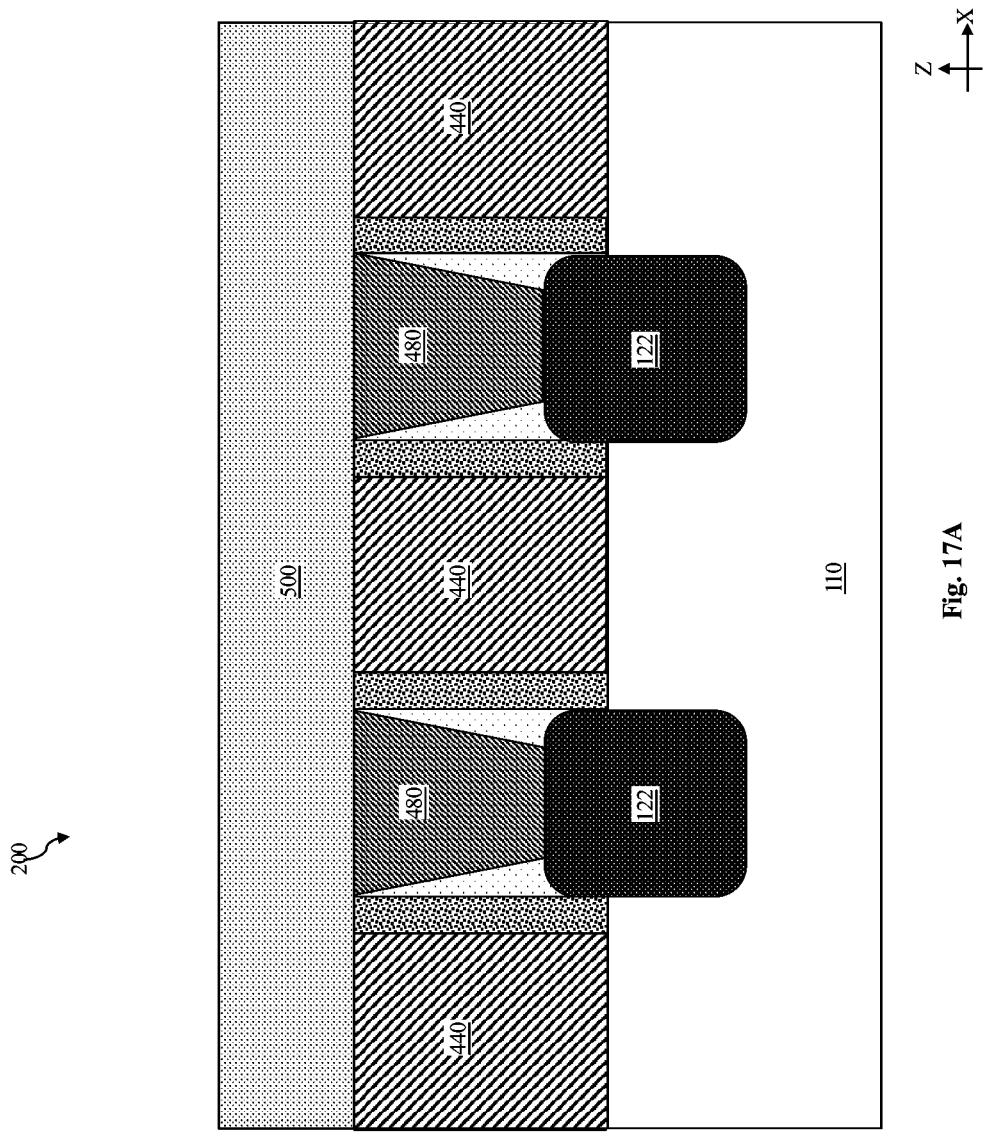
Figure 17B:
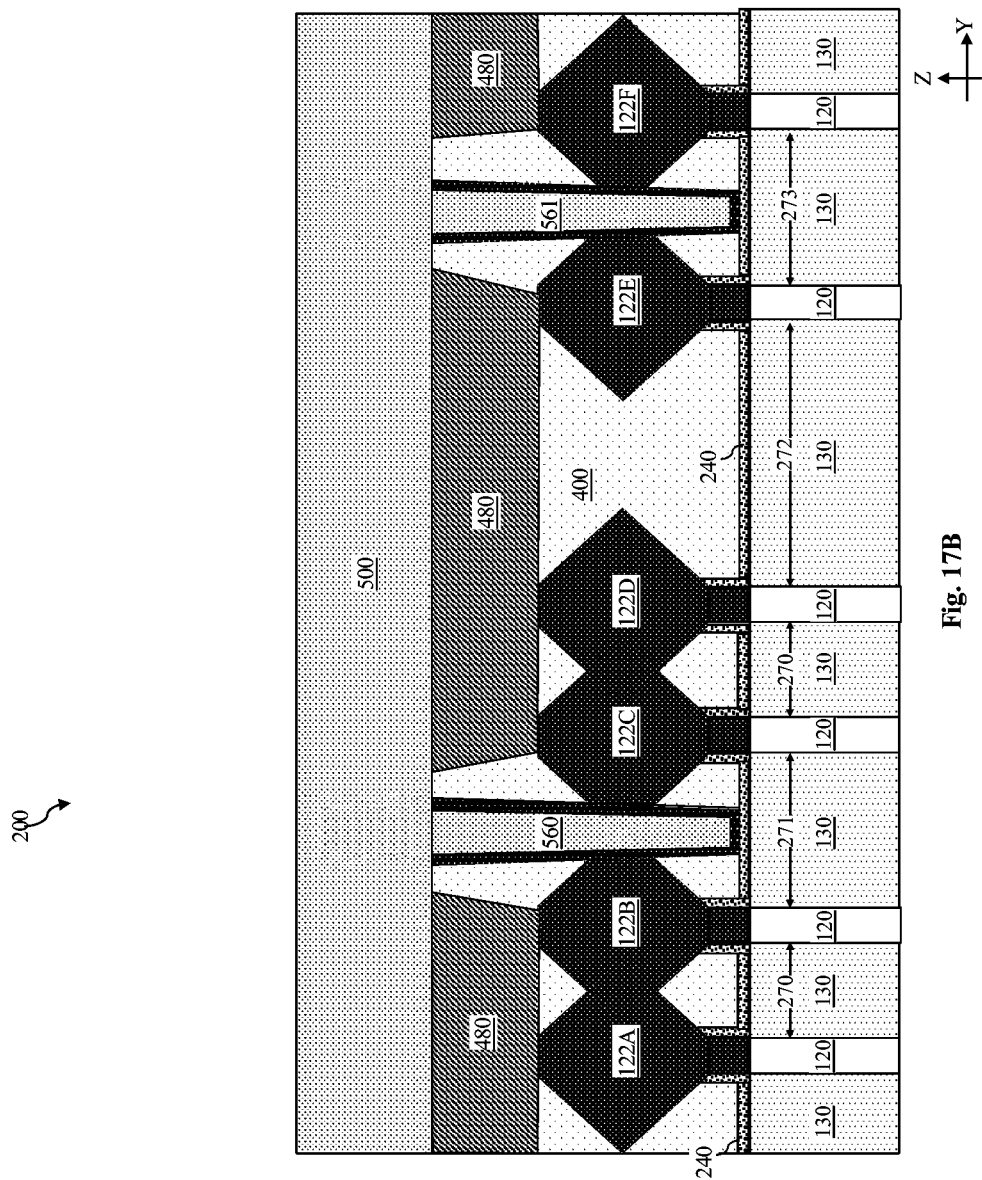

Referring now to FIGS. 17A-17B, the processes discussed above with reference to FIGS. 7A-9A and 7B-9B are performed to the IC device 200, including the source/drain contact formation process 460 to form the source/drain contacts 480, and the deposition process 490 to form the dielectric layer 500 (i.e., the ILD1). Since these processes have already been discussed above in detail with respect to the first embodiment, they are not repeated herein for the third embodiment.

FIGS. 18A-20A and 18B-20B pertain to a fourth embodiment of the present disclosure, in which the merged source/drain components 122 are broken up after the source/drain contacts 480 are formed, but before additional metallization (e.g., vias formed on the source/drain contacts 480) is formed. This fourth embodiment of the present disclosure will now be discussed below in more detail. For reasons of consistency and clarity, similar components appearing in the first, second, third, and fourth embodiments will be labeled the same.

Figure 18A:
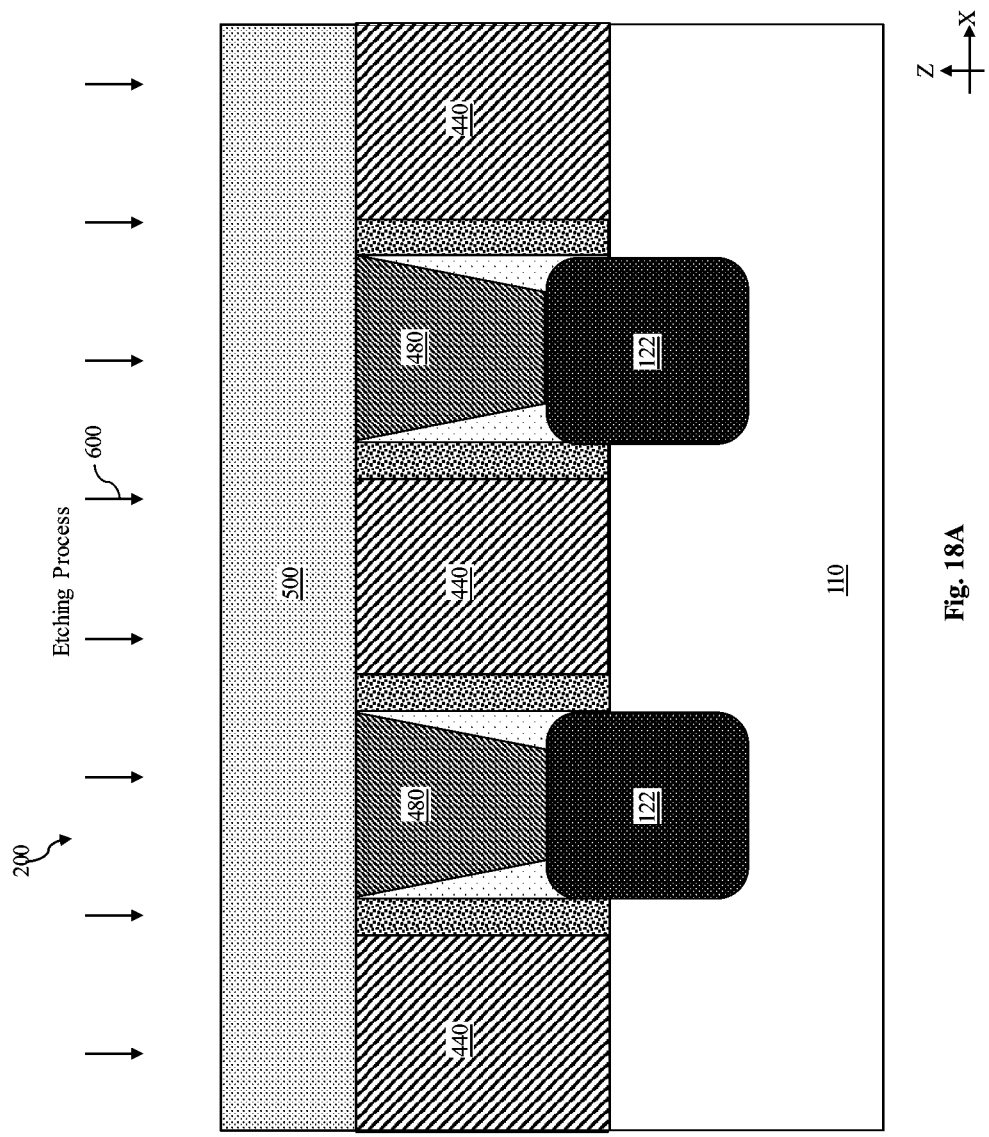
Figure 18B:
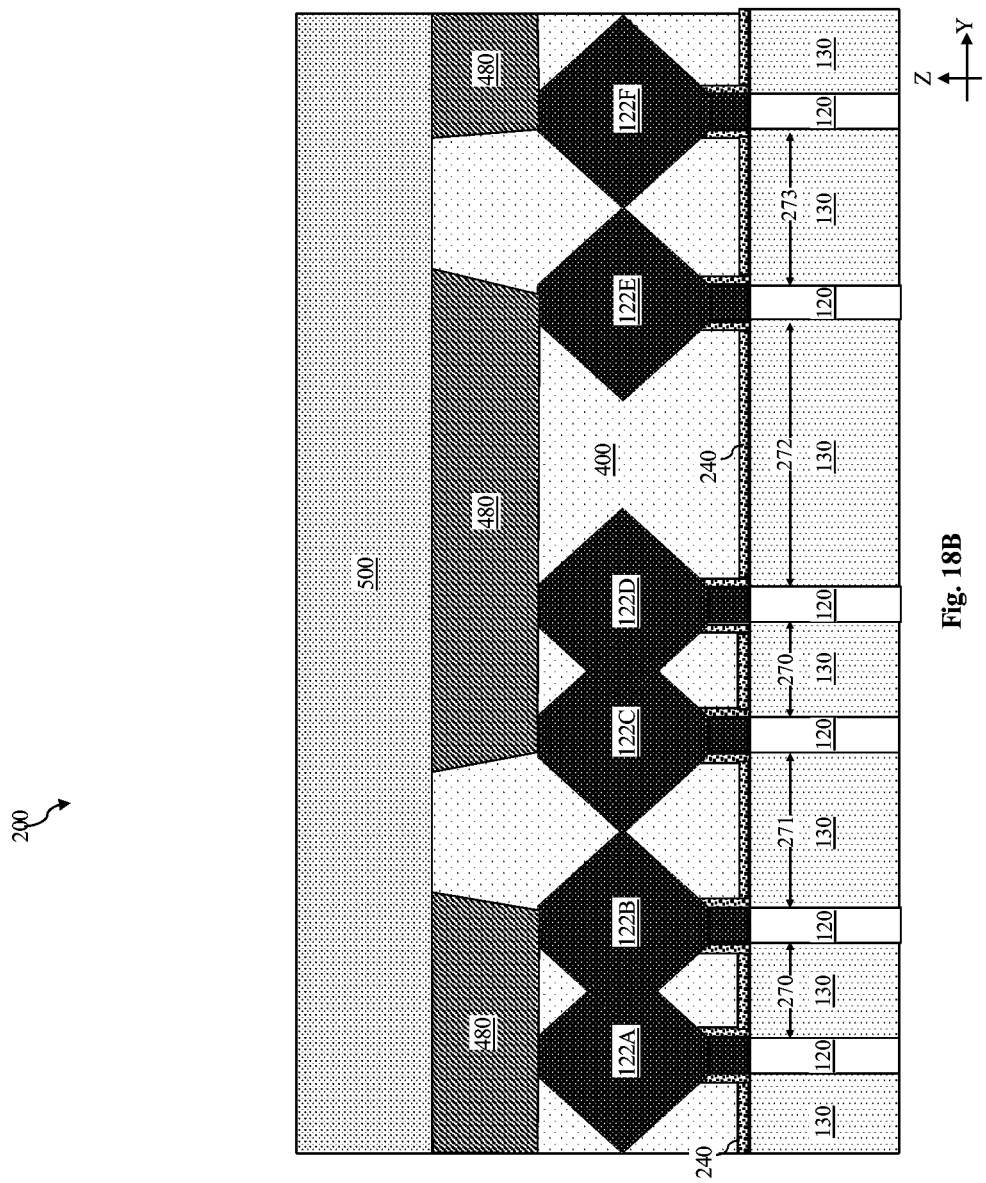

Referring now to FIGS. 18A-18B, the source/drain components 122 have been epitaxially grown, the dielectric layer 400 (i.e., ILD0) has been formed, the dummy gate structures 210 have been replaced by the HKMG structures 440, the source/drain contacts 480 have been formed, and the dielectric layer 500 (i.e., ILD1) has also been formed. At this stage of fabrication, the merged source/drain components 122A-122B, 122C-122D, and 122E-122F are not broken up yet, as shown in FIG. 18B.

Figure 19A:
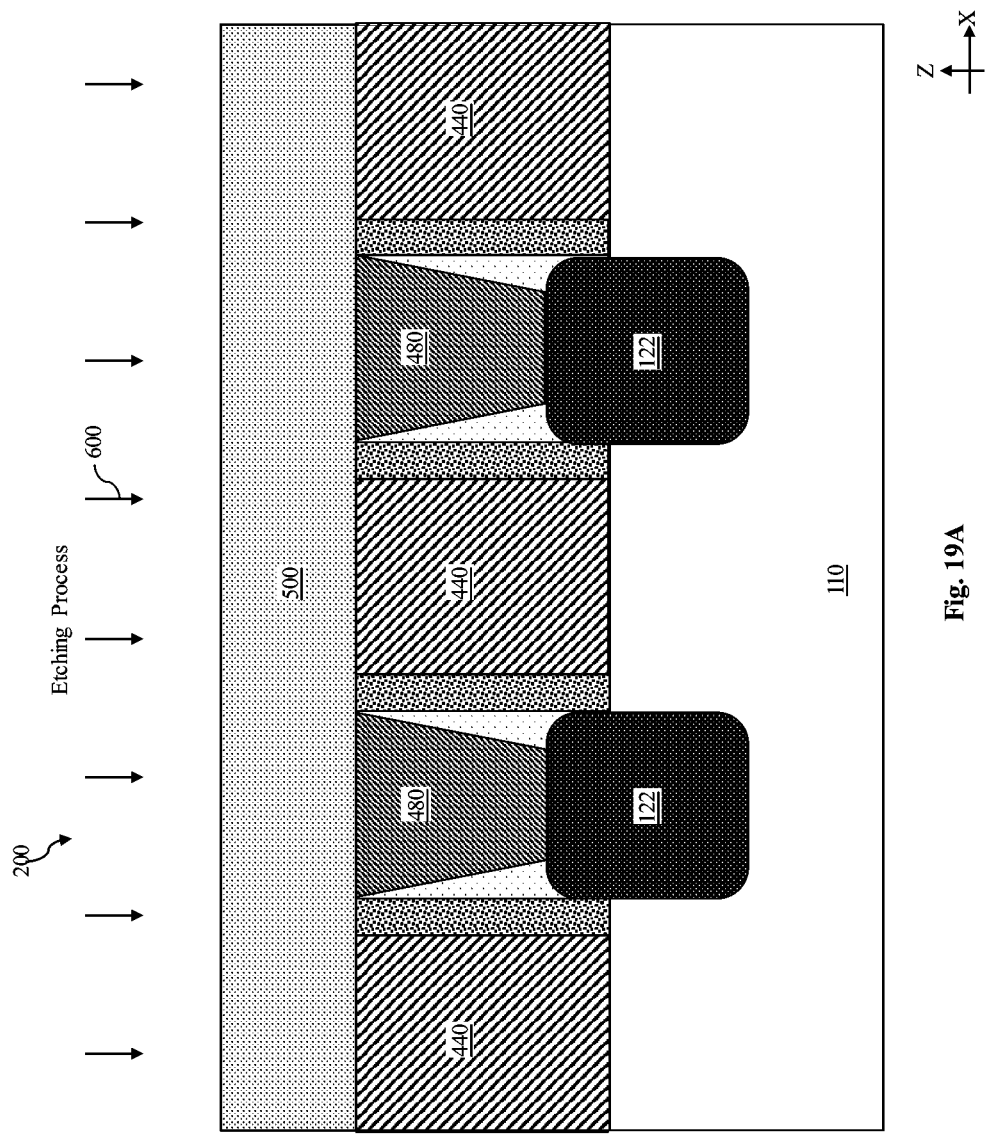
Figure 19B:
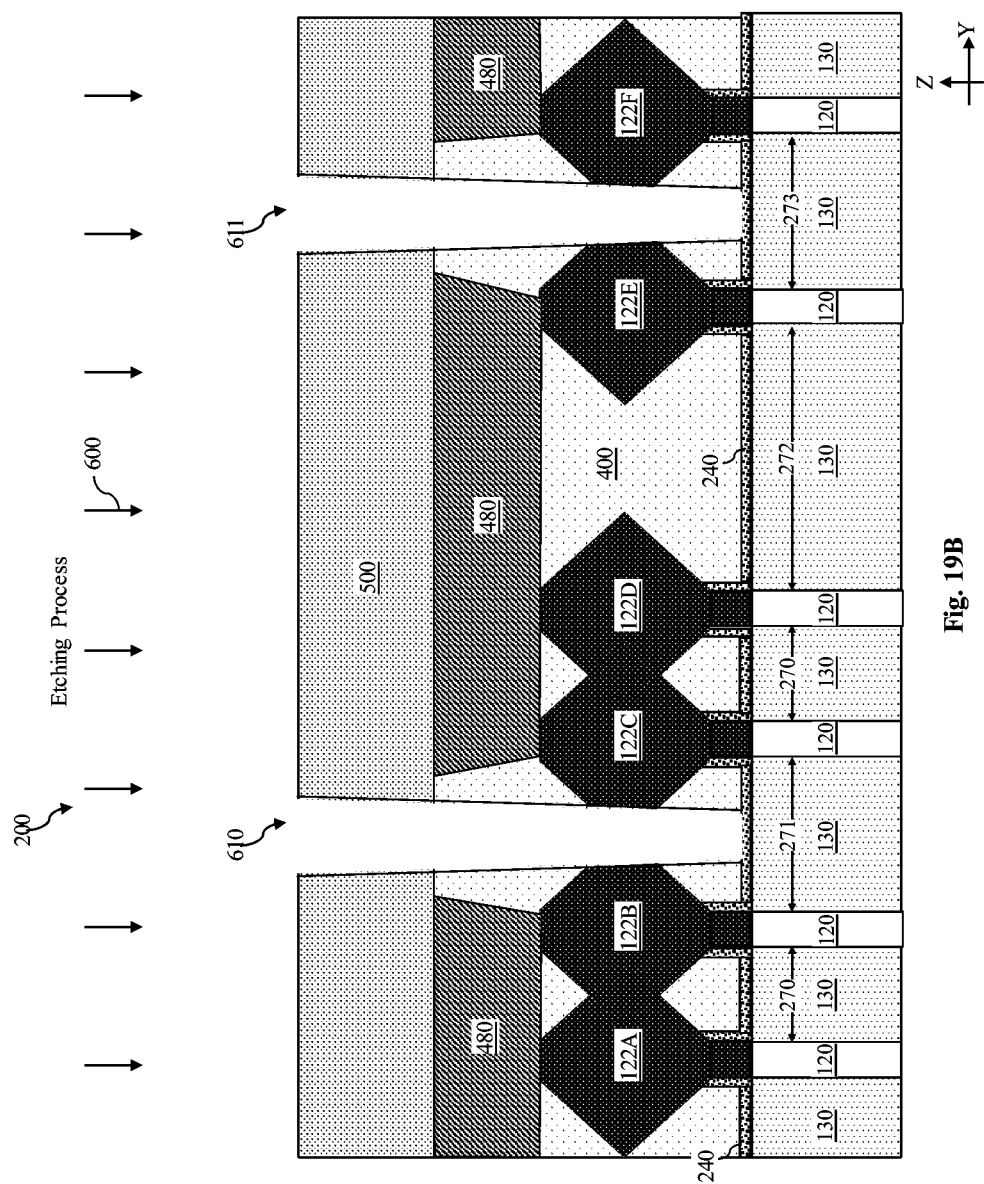

Referring now to FIGS. 19A-19B, an etching process 600 is performed to form openings 610 and 611 that extend vertically through the dielectric layer 500 and through the dielectric layer 400. Compared to the openings 540-541 discussed above with reference to the second and third embodiments, the openings 610-611 of the fourth embodiment is deeper, since they have to extend through both of the dielectric layers 500 and 400. In other words, the openings 610-611 have greater aspect ratios than the openings 540-541. Nevertheless, the openings 610-611 may still have smaller aspect ratios than the openings 340-341 of the first embodiment (shown in FIG. 4B). In any case, the opening 610 "breaks up" the merged portions of the source/drain components 122B-122C of the NFETs, and the opening 611 "breaks up" the merged portions of the source/drain components 122E-122F of the PFETs. Due to the location of the cross-sectional cut of FIG. 18A, the openings 610-611 are not directly visible in FIG. 19A.

Figure 20A:
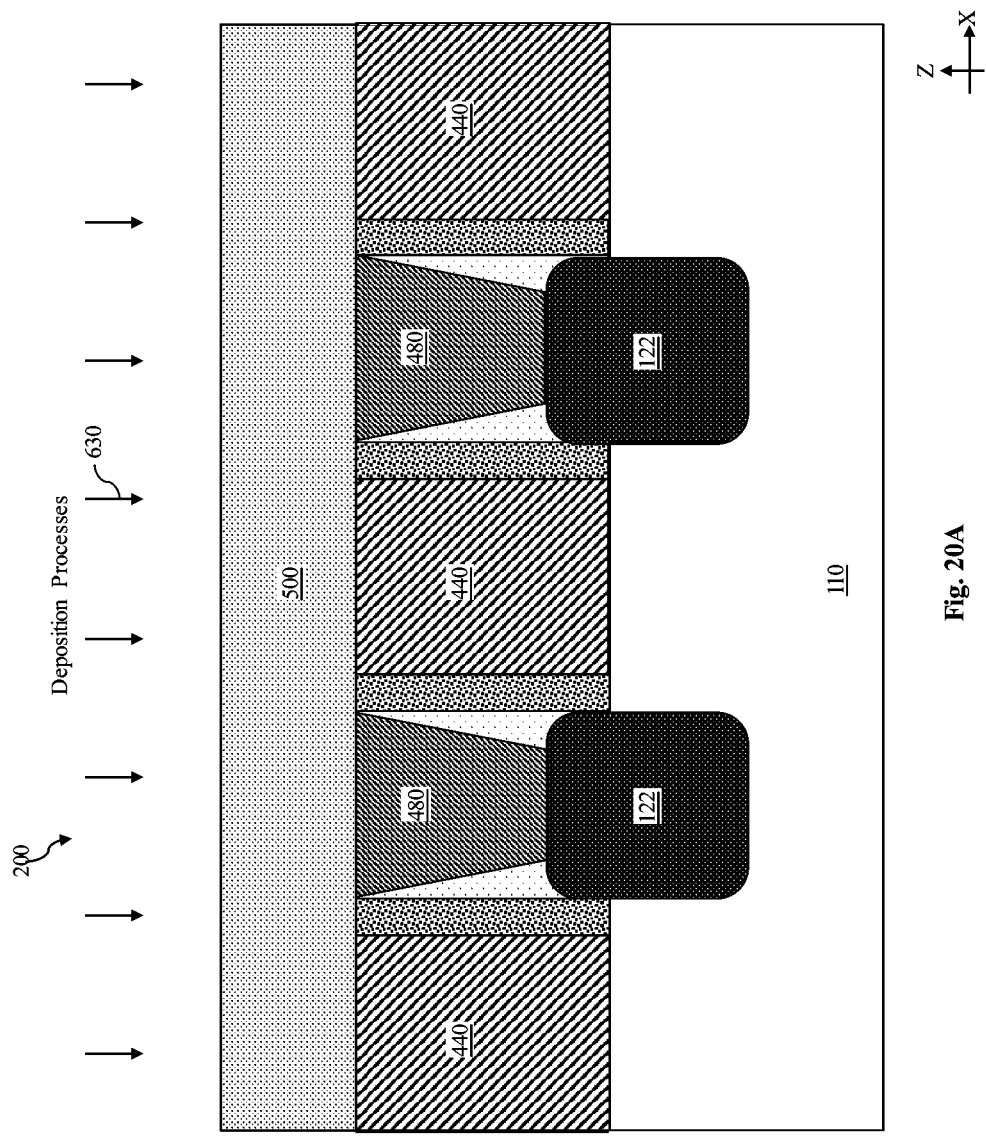
Figure 20B:
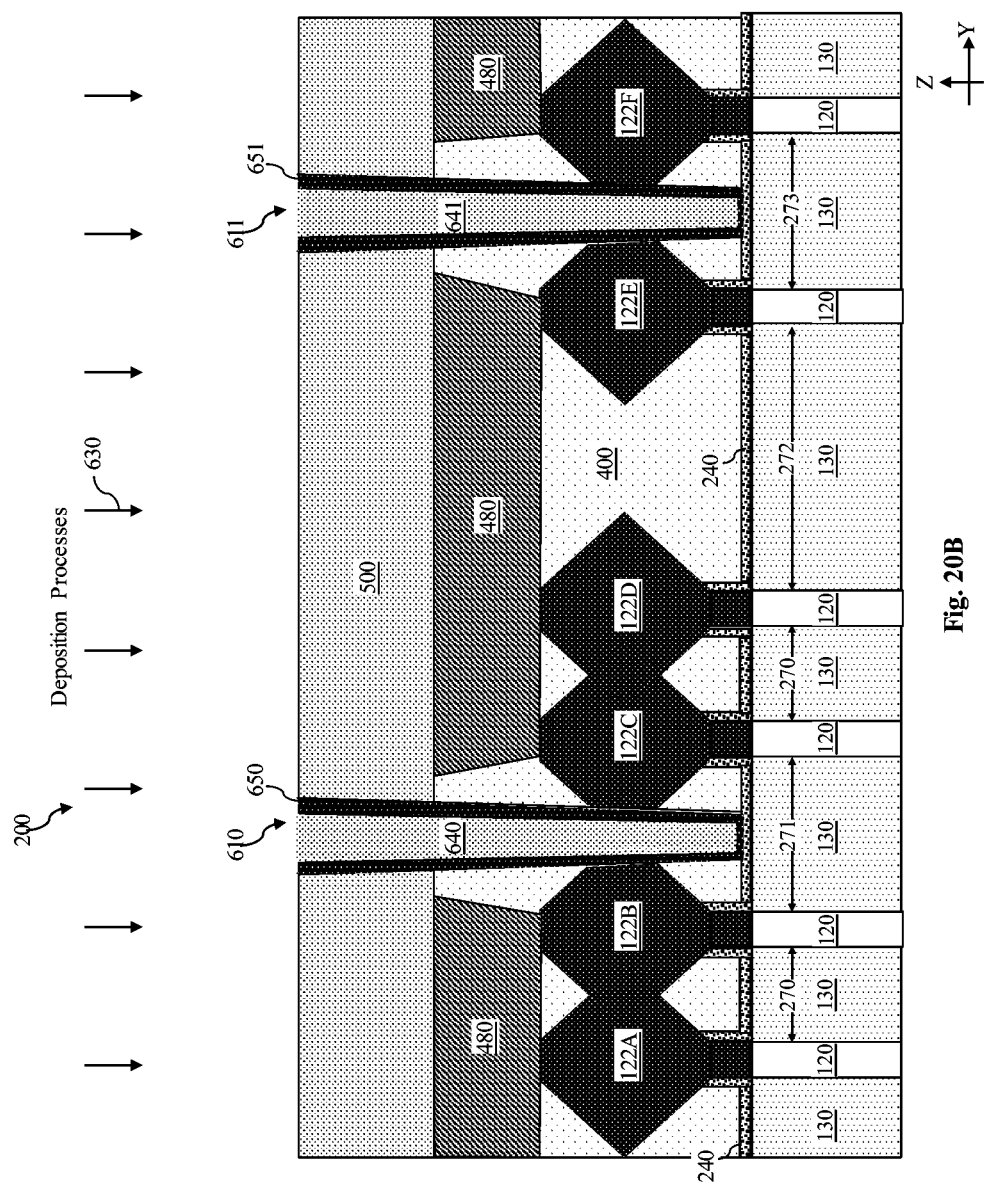

Referring now to FIGS. 20A-20B, one or more deposition processes 630 is performed. The one or more deposition processes 630 may be similar to the one or more deposition processes 550 discussed above. In other words, the one or more deposition processes 630 form isolation structures 640 and 641 in the openings 610 and 611, respectively. Similar to the isolation structures 560-561, the isolation structures 640 and 641 may include silicon nitride, silicon oxide, silicon oxynitride, silicon carbon oxynitride, silicon carbide, a high-k dielectric material, or a low-k dielectric material. The isolation structures 640-641 may also each have a single layer scheme or a dual-layer scheme (e.g., including liners 650-651, respectively). The isolation structures 640-641 effectively provide electrical and physical separation between the source/drain components 122B-122C and between the source/drain components 122E-122F. As such, undesirable merging between the adjacent source/drain components are prevented.

Figure 21A:
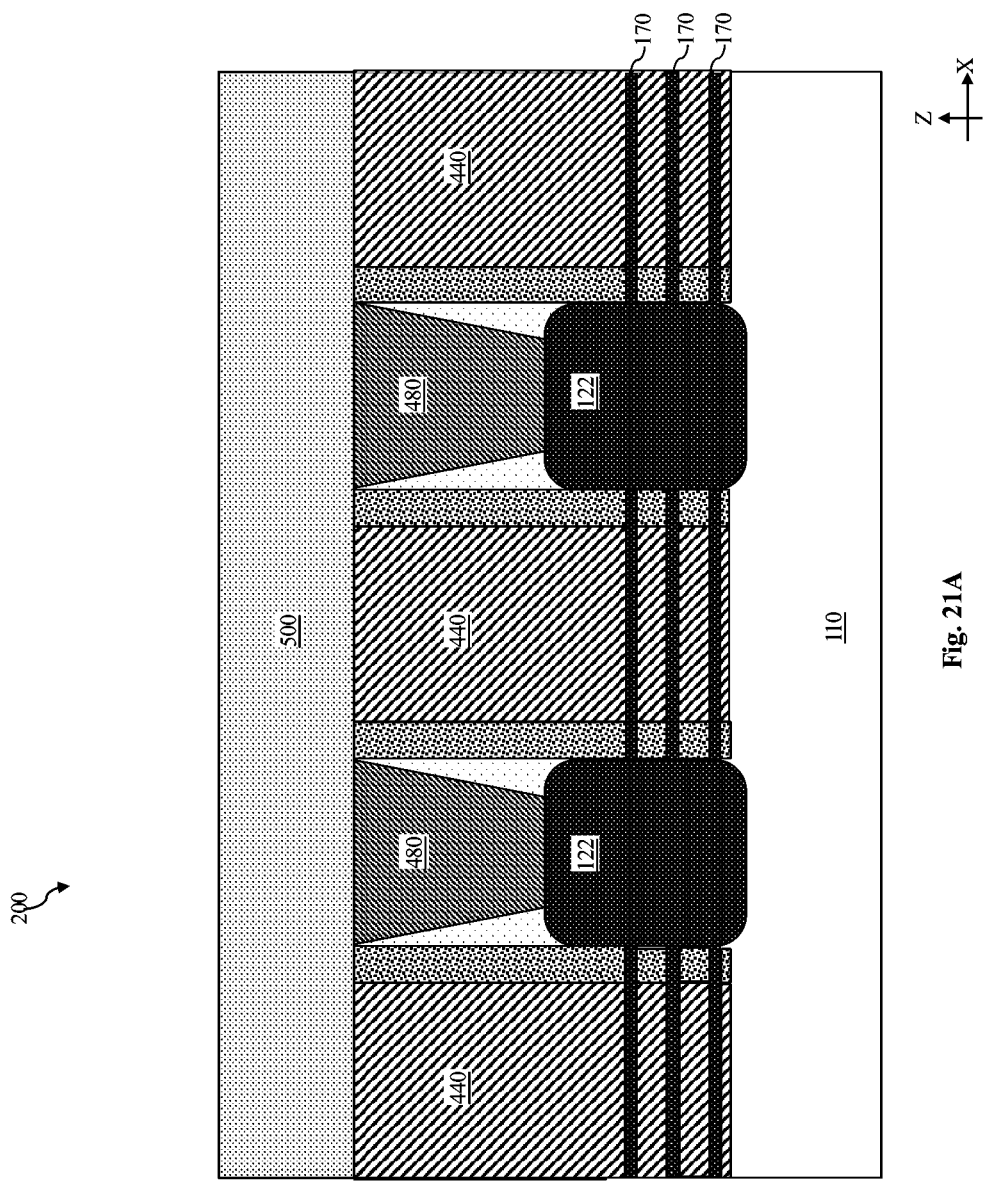
Figure 21B:
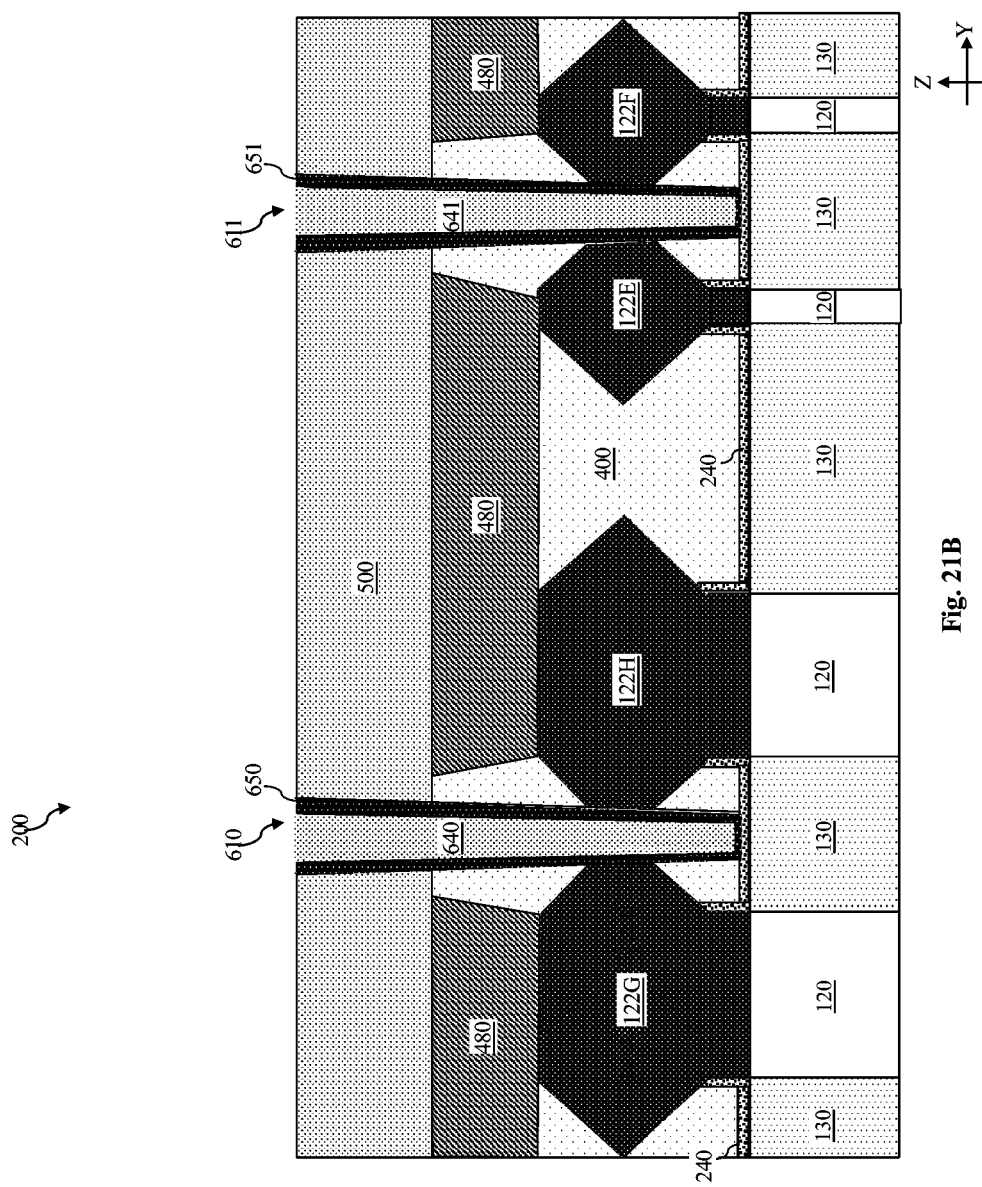

In the discussions above pertaining to embodiments one through four, the IC device 200 is in the form of a FinFET. However, the inventive concepts of the present disclosure may apply to a multi-channel device as well, such as a gate-all-around (GAA) device similar to the GAA device 150 of FIG. 1C. FIGS. 21A-21B illustrate an embodiment of the present disclosure where the IC device 200 is in the form of a GAA device. FIG. 21A illustrates an X-cut where the cross-sectional cut is taken along the cutline A-A' of FIG. 1C, and FIG. 21B illustrates an Y-cut where the cross-sectional cut is taken along the cutline B-B' of FIG. 1C. Again, for reasons of consistency and clarity, similar components appearing in FIGS. 21A-21B and in the FinFET embodiments discussed above will be labeled the same.

As shown in the X-cut view of FIG. 21A, the IC device 200 includes a plurality of nano-structures 170 as discussed above with reference to FIG. 1C. The nano-structures 170 each extend in the X-direction and may include nano-sheets, nano-tubes, nano-wires, or some other form of nano-structures. Each of the nano-structures 170 has regions that are circumferentially surrounded by the HKMG gate structures 440, where the HKMG structures 440 each include a high-k gate dielectric and a metal-containing gate electrode. These regions of the nano-structures 170 serve as the channel regions of the transistors, and thus each transistor includes multiple channels (since there are multiple nano-structures 170 per transistor). As shown in FIG. 21B, the isolation structure 640 physically separates the source/drain components 122G and 122H of the NFETs, and the isolation structure 641 physically separates the source/drain components 122E and 122F of the PFETs. Note that the isolation structures 640 and 641 are manufactured according to the fourth embodiment of the FinFETs discussed above (e.g., formed after the source/drain contacts 480 are formed). However, the first, second, and third embodiments of the FinFET may also apply to the GAA device herein too. For reasons of simplicity, the discussions of these embodiments are not repeated in detail herein.

Figure 22:
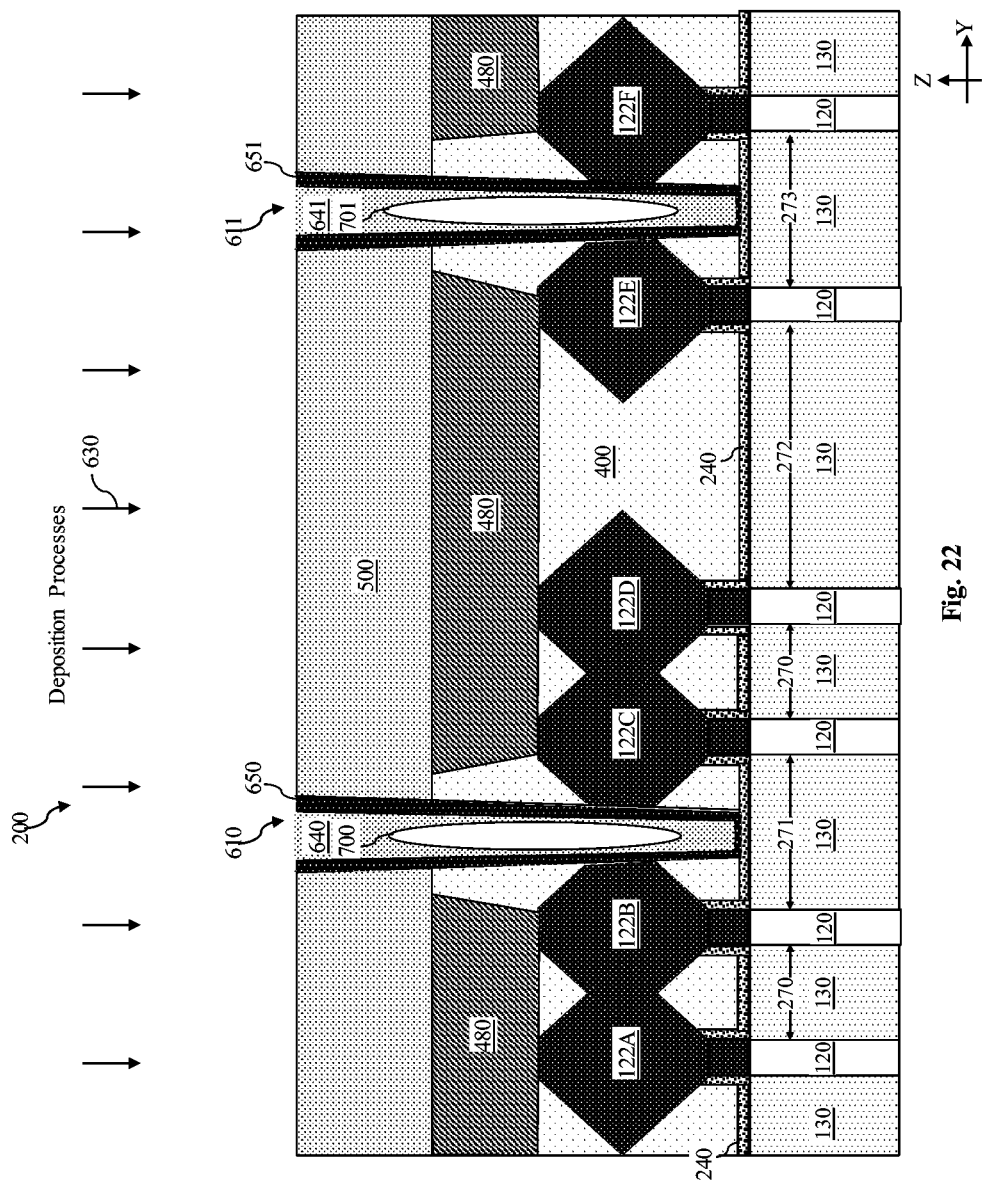

FIG. 22 illustrates another embodiment of the present disclosure, where an air gap or void is formed in the isolation structure. For example, using the fourth embodiment of the FinFET as an example, the isolation structures 640 and 641 may have an air gap 700 and an air gap 701 trapped therein, respectively. The air gaps 700 and 701 may be formed by filling the openings 610 and 611 with a material with poor gap filling properties, which can then trap the air gaps 700 and 701 inside the isolation structures 640 and 641, respectively. The air gaps 700 and 701 may help lower parasitic capacitance, since air has a low dielectric constant of close to 1. It is understood that the air gaps 700 and 701 may be formed in the isolation structures in each of the four FinFET embodiments discussed above, as well as in the GAA embodiments.

It is understood that the isolation structures of the present disclosure need not be formed for all types of IC devices or throughout the wafer. Rather, they may be selectively formed for IC devices having small spacings between active regions (e.g., small spacings between fin structures of adjacent transistors), which may be located in a certain region of the wafer but not in other regions of the wafer. For example, a wafer may include a first region where the IC devices have relatively small active region spacing and a second region where the IC devices have relatively large active region spacing. As such, the source/drain components in the first region may be more at-risk of unintentionally merging into one another, but the source/drain components in the second region are not. Hence, the isolation structures discussed above may be selectively formed in the first region, but not in the second region.

Figure 23:
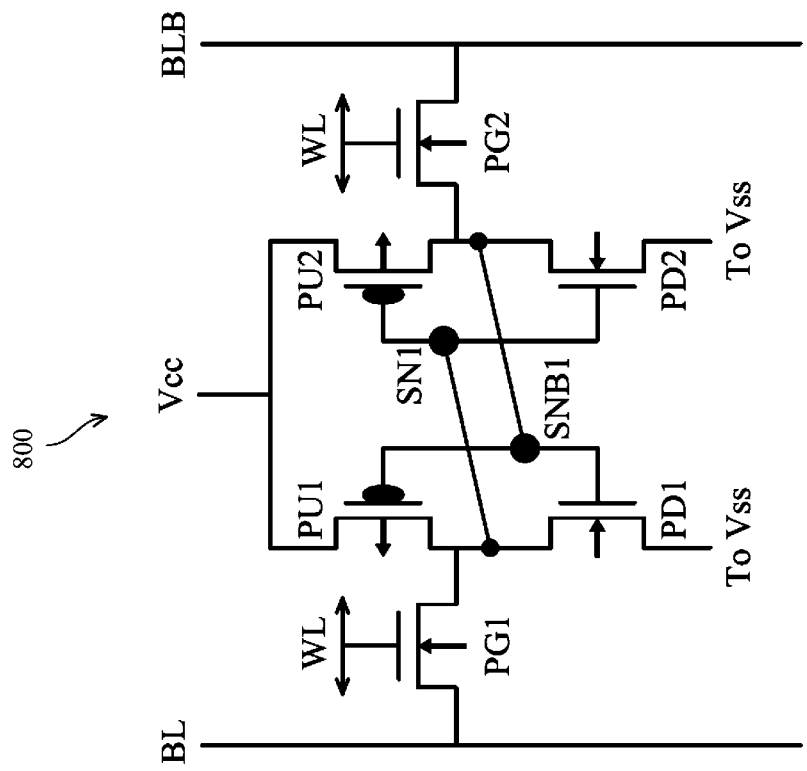
FIG. 23 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 23 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 24:
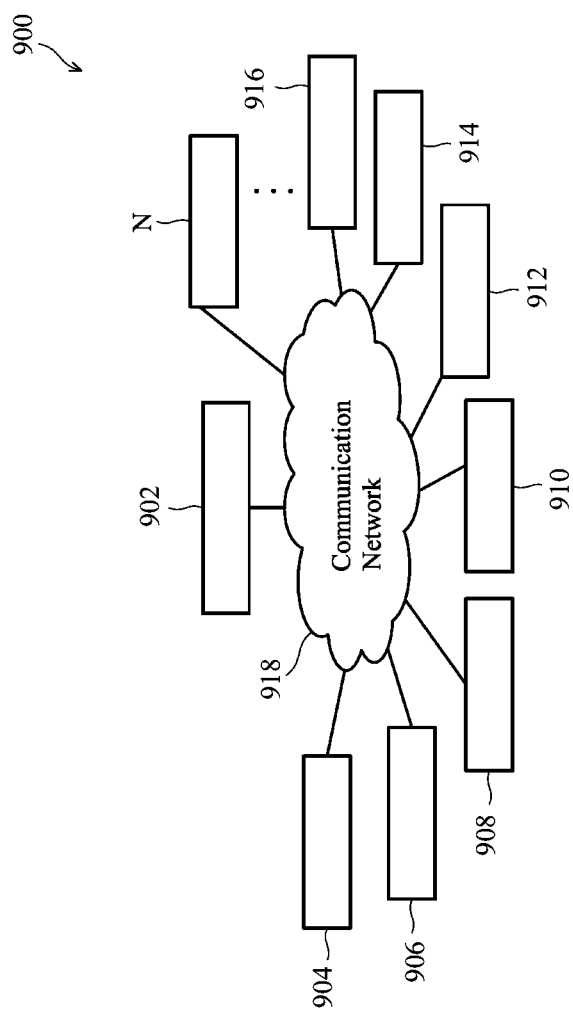
FIG. 24 is a block diagram of a manufacturing system according to various aspects of the present disclosure.

FIG. 24 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 25 is a flowchart illustrating a method 1000 of fabricating a semiconductor device according to embodiments of the present disclosure. The method 1000 includes a step 1010 to forming a first active region and a second active region over a substrate.

The method 1000 includes a step 1020 to epitaxially grow a first source/drain component and a second source/drain component over the first active region and the second active region, respectively.

The method 1000 includes a step 1030 to form a material layer over the first source/drain component and the second source/drain component.

The method 1000 includes a step 1040 to etch an opening through the material layer. The opening separates the first source/drain component from the second source/drain component.

The method 1000 includes a step 1050 to fill the opening with one or more dielectric materials.

In some embodiments, the first source/drain component and the second source/drain component merge into each other after the epitaxially growing.

In some embodiments, the step 1050 includes filling the opening with a single type of dielectric material.

In some embodiments, the step 1050 includes: depositing a dielectric liner in the opening, wherein the dielectric liner partially fills the opening; and depositing a dielectric material over the dielectric liner, wherein the dielectric material completely fills the opening.

In some embodiments, the step 1030 includes forming a sacrificial layer as the material layer. The method 1000 may further include the following steps: removing the sacrificial layer after the opening has been etched in the sacrificial layer; after the sacrificial layer has been removed, forming an interlayer dielectric (ILD) over and around the first source/drain component and the second source/drain component; after the ILD has been formed, forming a metal-containing gate structure over the substrate; and after the forming of the metal-containing gate structure, forming a first source/drain contact over the first source/drain component and forming a second source/drain contact over the second source/drain component. In some embodiments, the forming the sacrificial layer includes forming a photoresist layer as the sacrificial layer.

In some embodiments, the step 1030 includes forming an interlayer dielectric (ILD) as the material layer. The method 1000 may further include the following steps: after the filling of the opening, forming a metal-containing gate structure over the substrate; and after the forming of the metal-containing gate structure, forming a first source/drain contact over the first source/drain component and forming a second source/drain contact over the second source/drain component.

In some embodiments, the step 1030 includes forming an interlayer dielectric (ILD) as the material layer. The method 1000 may further include the following steps: before the etching of the opening, forming a metal-containing gate structure over the substrate; and after the filling the opening with the one or more dielectric materials, forming a first source/drain contact over the first source/drain component and forming a second source/drain contact over the second source/drain component.

In some embodiments, the step 1030 includes forming an interlayer dielectric (ILD) as the material layer. The method 1000 may further include the following steps before the etching of the opening: forming a metal-containing gate structure over the substrate; and forming a first source/drain contact over the first source/drain component and forming a second source/drain contact over the second source/drain component. The etching of the opening is performed after the first source/drain contact and the second source/drain contact have been formed.

It is understood that the method 1000 may include further steps performed before, during, or after the steps 1010-1050. For example, the method 1000 may include steps of forming dummy gate structures, replacing the dummy gate structures with HKMG structures, forming additional metallization layers, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms a dielectric isolation structure between epitaxially-grown source/drain components of different transistors. In some embodiments, such a dielectric isolation structure may be formed by forming a sacrificial layer around the source/drain components, etching an opening through the sacrificial layer, where the opening separates the source/drain components, removing the sacrificial layer, and forming a dielectric layer (e.g., ILD0) around the source/drain components. A portion of the dielectric layer formed between the source/drain components will serve as the dielectric isolation structure. In some other embodiments, such a dielectric isolation structure may be formed by forming a dielectric layer (e.g., ILD0) around the source/drain components, etching an opening through the dielectric layer, where the opening separates the source/drain components, and filling the opening with one or more dielectric layers. A dielectric layer(s) filling the opening will serve as the dielectric isolation structure. In these embodiments, the opening may be etched before the formation of the HKMG structures, or after the formation of the HKMG structures but before the formation of source/drain contacts, or after the formation of the source/drain contacts.

Forming such a dielectric isolation structure between certain source/drain components may offer advantages over conventional devices. However, it is understood that not all advantages are discussed herein, different embodiments may offer different advantages, and that no particular advantage is required for any embodiment. One advantage is that undesirable electrical shorting may be prevented. In more detail, as semiconductor feature sizes continue to shrink with each technology generation, the source/drain components (epitaxially grown over active regions) between adjacent transistors may merge into one another. For example, a source/drain component of a first transistor may merge into a source/drain component of a second transistor, even though the source/drain components of the first and second transistors are supposed to be kept separate physically. The merging may occur as a result of the shrinking distance between the active regions (e.g., fin structures) from which the source/drain components are grown. Thus, the margin for error may be small. When the source/drain components are grown to be larger than expected, or their locations are shifted slightly due to process variations, some of these source/drain components may merge together, even though they are meant to be kept separate. The merging source/drain components causes electrical shorting, which may degrade device performance and/or lower yield. Here, by forming the isolation structure between the source/drain components, the source/drain components that are supposed to be kept separate are indeed kept separate. In this manner, undesirable electrical shorting is prevented. Other advantages may include compatibility with existing fabrication processes (including for both FinFET and GAA processes) and the ease and low cost of implementation.

One aspect of the present disclosure pertains to a device. The device includes a first active region and a second active region disposed over a substrate. A first source/drain component is grown on the first active region. A second source/drain component is grown on the second active region. An interlayer dielectric (ILD) is disposed around the first source/drain component and the second source/drain component. An isolation structure extends vertically through the ILD and separates the first source/drain component from the second source/drain component.

Another aspect of the present disclosure pertains to a device. The device includes a plurality of active regions disposed over a substrate; a plurality of gate structures disposed over the active regions; and a plurality of source/drains epitaxially grown over the active regions, respectively. At least a first source/drain of the plurality of the source/drains has an asymmetrical profile in a cross-sectional view.

Yet another aspect of the present disclosure pertains to a method. The method includes forming a first active region and a second active region over a substrate; epitaxially growing a first source/drain component and a second source/drain component over the first active region and the second active region, respectively; forming a material layer over the first source/drain component and the second source/drain component; etching an opening through the material layer, wherein the opening separates the first source/drain component from the second source/drain component; and filling the opening with one or more dielectric materials.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first active region, a second active region, a third active region, and a fourth active region;
   a first epitaxial component, a second epitaxial component, a third epitaxial component, and a fourth epitaxial component formed on the first active region, the second active region, the third active region, and the fourth active region, respectively; and
   a dielectric material disposed between the second epitaxial component and the third epitaxial component;
   wherein:
   the first epitaxial component and the second epitaxial component are merged together;

the third epitaxial component and the fourth epitaxial component are merged together;
a first outermost lateral portion of the first epitaxial component is pointier than a second outermost lateral portion of the second epitaxial component in a cross-sectional side view; and
a fourth outermost lateral portion of the fourth epitaxial component is pointier than a third outermost lateral portion of the third epitaxial component in the cross-sectional side view.

2. The device of claim 1, wherein the first outermost lateral portion and the fourth outermost lateral portion each include a pointy tip, respectively.

3. The device of claim 2, wherein the point tip of the first outermost lateral portion and the pointy tip of the fourth outermost lateral portion point in opposite lateral directions.

4. The device of claim 1, wherein the second outermost lateral portion and the third outermost lateral portion each include a substantially linear edge, respectively.

5. The device of claim 1, wherein:
the first epitaxial component is wider than the second epitaxial component; and
the fourth epitaxial component is wider than the third epitaxial component.

6. The device of claim 1, wherein the dielectric material comprises an interlayer dielectric (ILD), and wherein the ILD further surrounds the first epitaxial component and the fourth epitaxial component.

7. The device of claim 1, wherein the first, second, third, and fourth epitaxial components are surrounded by an interlayer dielectric (ILD), and wherein the dielectric material comprises an isolation structure that extends vertically through the ILD.

8. The device of claim 7, wherein the isolation structure has a greater height than the first, second, third, and fourth epitaxial components.

9. The device of claim 7, wherein:
the isolation structure includes a dielectric segment and a dielectric liner that surrounds the dielectric segment; and
the dielectric liner is in direct physical contact with the second outermost lateral portion and the third outermost lateral portion.

10. The device of claim 9, wherein the dielectric segment has an air gap embedded therein.

11. The device of claim 1, further comprising:
a fifth active region and a sixth active region; and
a fifth epitaxial component and a sixth epitaxial component formed over the fifth active region and the sixth active region, respectively;
wherein:
the fifth epitaxial component includes a fifth outermost lateral portion and a sixth outermost lateral portion;
the sixth epitaxial component includes a seventh outermost lateral portion and an eighth outermost lateral portion;
the fifth outermost lateral portion is pointier than the sixth outermost lateral portion;
the eighth outermost lateral portion is pointier than the seventh outermost lateral portion; and
a portion of the dielectric material is further disposed between the fifth epitaxial component and the sixth epitaxial component.

12. The device of claim 1, wherein:
the device is a FinFET device or a Gate-All-Around (GAA) device; and
the first, second, third, and fourth epitaxial components are source/drains of the FinFET device or the GAA device.

13. A device, comprising:
a first active region, a second active region, a third active region, and a fourth active region each disposed over a substrate;
a first source/drain, a second source/drain, a third source/drain, and a fourth source/drain formed on the first active region, the second active region, the third active region, and the fourth active region, respectively, wherein the first source/drain is merged with the second source/drain in a horizontal direction, wherein the third source/drain is merged with the fourth source/drain in the horizontal direction, wherein the first source/drain is wider than the second source/drain in the horizontal direction, and wherein the fourth source/drain is wider than the third source/drain in the horizontal direction; and
a dielectric structure disposed between the second source/drain and the third source/drain;
wherein the first, second, third, and fourth source/drains are source/drains of FinFET devices or Gate-All-Around (GAA) devices.

14. The device of claim 13, wherein:
outermost horizontal portions of the first source/drain and the fourth source/drain have substantially pointy tips; and
outermost horizontal portions of the second source/drain and the third source/drain have substantially straight edges.

15. The device of claim 13, wherein the dielectric structure comprises an interlayer dielectric (ILD).

16. The device of claim 15, wherein the dielectric structure further comprises an isolation structure that extends vertically through the ILD, wherein the isolation structure and the ILD have different material compositions.

17. The device of claim 16, wherein the isolation structure includes an air gap embedded therein.

18. The device of claim 16, wherein an uppermost surface of the dielectric structure is more elevated vertically than uppermost surfaces of the first, second, third, and fourth source/drains.

19. A device, comprising:
a first active region and a second active region that each protrude vertically out of a substrate;
a first epitaxial structure that is grown over the first active region, wherein the first epitaxial structure protrudes farther out in a first horizontal direction than a second horizontal direction opposite the first horizontal direction;
a second epitaxial structure that is grown over the second active region, wherein the second epitaxial structure protrudes farther out in the second horizontal direction than the first horizontal direction; and
a dielectric structure separating the first epitaxial structure from the second epitaxial structure.

20. The device of claim 19, wherein:
the first epitaxial structure terminates into a first substantially pointy tip in the first horizontal direction;
the first epitaxial structure terminates into a first substantially flat edge in the second horizontal direction;
the second epitaxial structure terminates into a second substantially pointy tip in the second horizontal direction; and the second epitaxial structure terminates into a second substantially flat edge in the first horizontal direction.

* * * * *